[19] US009786507B2

(12) United States Patent
Anderson et al.

(10) Patent No.: US 9,786,507 B2
(45) Date of Patent: Oct. 10, 2017

(54) METHODS OF FORMING FIELD EFFECT TRANSISTORS USING A GATE CUT PROCESS FOLLOWING FINAL GATE FORMATION

(71) Applicant: International Business Machines Corporation, Armonk, NY (US)

(72) Inventors: Brent A. Anderson, Jericho, VT (US); Edward J. Nowak, Essex Junction, VT (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 15/134,713

(22) Filed: Apr. 21, 2016

(65) Prior Publication Data

US 2016/0233094 A1 Aug. 11, 2016

Related U.S. Application Data

(62) Division of application No. 14/462,631, filed on Aug. 19, 2014, now Pat. No. 9,373,641.

(51) Int. Cl.
*H01L 21/28* (2006.01)
*H01L 27/12* (2006.01)
(Continued)

(52) U.S. Cl.
CPC ...... *H01L 21/28123* (2013.01); *H01L 21/265* (2013.01); *H01L 21/31053* (2013.01);
(Continued)

(58) Field of Classification Search
None
See application file for complete search history.

(56) References Cited

U.S. PATENT DOCUMENTS 6,803,278 B2 10/2004 Tran
6,812,149 B1 11/2004 Wang et al.
(Continued)

FOREIGN PATENT DOCUMENTS

JP 2004-288685 10/2004
JP 2005-340461 12/2005
WO 2014059564 A1 4/2014

OTHER PUBLICATIONS

U.S. Appl. No. 14/462,631, Species Requirement dated Oct. 1, 2015, 6 pages.
(Continued)

*Primary Examiner* — Michelle Mandala
(74) *Attorney, Agent, or Firm* — Gibb & Riley, LLC; Steven J. Meyers

(57) ABSTRACT

Disclosed are field effect transistor (FET) formation methods using a final gate cut process and the resulting structures. One method forms an elongated gate across first and second semiconductor bodies for first and second FETs, respectively. An opening is formed in a portion of the elongated gate between the semiconductor bodies, cutting at least the gate conductor layer. The opening is filled with an isolation layer, thereby forming an isolation region that segments the elongated gate into first and second gates for the first and second FETs, respectively. Another method forms at least three gates across an elongated semiconductor body. An isolation region is formed that extends, not only through a portion of a center one of the gates, but also through a corresponding portion of the elongated semiconductor body adjacent to that gate, thereby segmenting the elongated semiconductor body into discrete semiconductor bodies for first and second FETs.

18 Claims, 31 Drawing Sheets

(51) Int. Cl.
*H01L 21/84* (2006.01)
*H01L 21/762* (2006.01)
*H01L 21/8234* (2006.01)
*H01L 29/66* (2006.01)
*H01L 21/3105* (2006.01)
*H01L 29/51* (2006.01)
*H01L 27/088* (2006.01)
*H01L 29/06* (2006.01)
*H01L 21/265* (2006.01)
*H01L 29/49* (2006.01)
*H01L 21/8238* (2006.01)
*H01L 23/528* (2006.01)
*H01L 27/092* (2006.01)
*H01L 29/08* (2006.01)
*H01L 29/10* (2006.01)

(52) U.S. Cl.
CPC ...... *H01L 21/762* (2013.01); *H01L 21/76283* (2013.01); *H01L 21/823431* (2013.01); *H01L 21/823437* (2013.01); *H01L 21/823481* (2013.01); *H01L 21/823807* (2013.01); *H01L 21/823814* (2013.01); *H01L 21/823821* (2013.01); *H01L 21/823871* (2013.01); *H01L 21/823878* (2013.01); *H01L 21/845* (2013.01); *H01L 23/528* (2013.01); *H01L 27/0886* (2013.01); *H01L 27/0924* (2013.01); *H01L 27/1211* (2013.01); *H01L 29/0649* (2013.01); *H01L 29/0653* (2013.01); *H01L 29/0847* (2013.01); *H01L 29/1033* (2013.01); *H01L 29/495* (2013.01); *H01L 29/4966* (2013.01); *H01L 29/517* (2013.01); *H01L 29/6681* (2013.01)

(56) References Cited

U.S. PATENT DOCUMENTS

| | | | |
|---|---|---|---|
| 6,921,711 | B2 | 7/2005 | Cabral, Jr. et al. |
| 7,049,185 | B2 | 5/2006 | Ito |
| 7,525,173 | B2 | 4/2009 | Yang et al. |
| 7,569,887 | B2 | 8/2009 | Otsuki |
| 7,671,469 | B2 | 3/2010 | Lee et al. |
| 7,785,946 | B2 | 8/2010 | Haffner et al. |
| 8,546,208 | B2 | 10/2013 | Anderson et al. |
| 2005/0169052 | A1 | 8/2005 | Hsu et al. |
| 2006/0125024 | A1 | 6/2006 | Ishigaki |
| 2008/0079088 | A1 | 4/2008 | Kudo |
| 2009/0057813 | A1* | 3/2009 | Wei ............... H01L 21/76224 257/510 |
| 2010/0148248 | A1 | 6/2010 | Mikasa |
| 2010/0193877 | A1 | 8/2010 | Liaw |
| 2011/0147765 | A1 | 6/2011 | Huang et al. |
| 2012/0292694 | A1* | 11/2012 | Hsieh ............... H01L 29/407 257/331 |
| 2012/0326207 | A1* | 12/2012 | Yoshimochi ...... H01L 29/866 257/139 |
| 2013/0181301 | A1 | 7/2013 | Witters et al. |
| 2014/0061799 | A1 | 3/2014 | Fan et al. |
| 2014/0110784 | A1 | 4/2014 | Jagannathan et al. |
| 2014/0141598 | A1 | 5/2014 | Ando et al. |
| 2015/0279935 | A1 | 10/2015 | Xie et al. |

OTHER PUBLICATIONS

U.S. Appl. No. 14/462,631, Office Action Communication dated Dec. 18, 2015, 6 pages.

U.S. Appl. No. 14/462,631, Notice of Allowance dated Mar. 25, 2016, 5 pages.

* cited by examiner

METHODS OF FORMING FIELD EFFECT TRANSISTORS USING A GATE CUT PROCESS FOLLOWING FINAL GATE FORMATION

CROSS-REFERENCE TO RELATED APPLICATIONS

This application is a Divisional of U.S. application Ser. No. 14/462,631 filed Aug. 19, 2014, issued as U.S. Pat. No. 9,373,641 on Jun. 21, 2016, the complete disclosure of which, in its entirety, is herein incorporated by reference.

BACKGROUND

The present invention relates to semiconductor structures and, more specifically, to methods of forming field effect transistors (FETs) using a gate cut process following final gate formation in order to allow for an increase in device density.

Generally, at least one goal for designing new integrated circuits is to increase device density. However, with conventional methods of forming field effect transistors (FETs), the ability to increase device density is limited due to requirements for gate-to-gate spacing as well as semiconductor body-to-semiconductor body spacing. Specifically, during conventional FET processing, adjacent gates (e.g., gates in end-to-end alignment) are typically spaced some fixed minimum predetermined distance apart in order to avoid subsequent processing-induced shorting between the gates, thereby limiting an increase in device density. Similarly, adjacent semiconductor bodies (e.g., semiconductor bodies, such as semiconductor fins, in end-to-end alignment) must be spaced some fixed minimum predetermined distance apart in order to avoid shorting, thereby also limiting an increase in device density. Therefore, there is a need in the art for improved methods of forming FETs that allow the spacing between gates and/or the spacing between semiconductor bodies to be decreased and that, thereby allow for an increase in device density.

SUMMARY

In view of the foregoing, disclosed herein are methods of forming semiconductor structures comprising multiple field effect transistors (FETs). These methods each use a gate cut process following final gate formation in order to allow for an increase in device density. For example, in one method, an elongated gate (e.g., an elongated replacement metal gate) can be formed across at least two semiconductor bodies, including a first semiconductor body for a first FET and a second semiconductor body for a second FET. Then, an opening can be formed that extends vertically into a portion of the elongated gate between the two semiconductor bodies, cutting at least the gate conductor layer of the elongated gate. This opening can be filled with an isolation layer so as to form an isolation region that effectively segments the elongated gate into a first gate for the first FET and a second gate for the second FET and that electrically isolates the first gate from the second gate. In another method, multiple gates (e.g., replacement metal gates), including a first gate for a first FET, a second gate for a second FET and a third gate between the first and second gates, can be formed across an elongated semiconductor body. Then, an isolation region can be formed that extends through a portion of the third gate and further through a corresponding portion of the elongated semiconductor body adjacent to the third gate. This isolation region can effectively segment the elongated semiconductor body into two discrete semiconductor bodies for the first FET and the second FET, respectively, and can electrically isolate those semiconductor bodies. Also disclosed are the semiconductor structures resulting from these methods.

More particularly, disclosed herein is a first method of forming a semiconductor structure comprising multiple field effect transistors (FETs). This first method can comprise forming multiple semiconductor bodies for the multiple FETs including, but not limited to, a first semiconductor body for a first FET and a second semiconductor body parallel and adjacent to the first semiconductor body for a second FET. Subsequently, an elongated gate (e.g., an elongated replacement metal gate), which is laterally surrounded by a gate sidewall spacer, can be formed so as to traverse the multiple semiconductor bodies.

After forming the elongated gate, an isolation region can be formed in a portion of the elongated gate that extends laterally between the first semiconductor body and the second semiconductor body. To form this isolation region, an opening can be formed that extends vertically into the portion of the elongated gate between the first semiconductor body and the second semiconductor body and that cuts at least a gate conductor layer of the elongated gate into discrete segments. Then, an isolation layer can be deposited, filling the opening such that the isolation layer is positioned laterally between and immediately adjacent to the discrete segments of the gate conductor layer. The resulting isolation region effectively segments the elongated gate into a first gate for the first FET and a second gate for the second FET and electrically isolates those two gates from each other (i.e., electrically isolates the first gate from the second gate).

Following formation of the isolation region in the elongated gate, additional processing can be performed to complete the first and second FETs. This additional processing can include, but is not limited to, interlayer dielectric deposition and formation of contacts to the various components of the FETs (e.g., to the first and second gates of the first and second FETs, respectively).

Also disclosed herein is a semiconductor structure that comprises multiple field effect transistors (FETs) and that is formed according to the first method described above. This semiconductor structure can comprise multiple semiconductor bodies for the multiple FETs. Specifically, the multiple semiconductor bodies can comprise at least a first semiconductor body for a first FET and a second semiconductor body parallel and adjacent to the first semiconductor body for a second FET. The semiconductor structure can further comprise an elongated gate (e.g., an elongated replacement metal gate), which is laterally surrounded by a gate sidewall spacer and which traverses the multiple semiconductor bodies.

The semiconductor structure can further comprise an isolation region in a portion of the elongated gate that extends laterally between the first semiconductor body and the second semiconductor body. This isolation region can comprise an opening that extends vertically into the portion of the elongated gate between the first semiconductor body and the second semiconductor body and that cuts at least a gate conductor layer of the elongated gate into discrete segments. The isolation region can further comprise an isolation layer that fills the opening such that it is positioned laterally between and immediately adjacent to the discrete segments of the gate conductor layer. Such an isolation region effectively segments the elongated gate into a first gate for the first FET and a second gate for the second FET and electrically isolates those two gates from each other (i.e., electrically isolates the first gate from the second gate).

The semiconductor structure can further comprise an interlayer dielectric over the first and second FETs and contacts extending vertically through the interlayer dielectric to the various components of the FETs (e.g., to the first and second gates of the first and second FETs, respectively).

Also disclosed herein is a second method of forming a semiconductor structure that comprises multiple field effect transistors (FETs). This second method can comprise forming an elongated semiconductor body. After the elongated semiconductor body is formed, multiple gates (e.g., replacement metal gates) can be formed across that elongated semiconductor body. These multiple gates can comprise at least a first gate for a first FET, a second gate for a second FET and a third gate between the first gate and the second gate.

Subsequently, an isolation region can be formed that extends through a portion of the third gate and further through a corresponding portion of the elongated semiconductor body immediately adjacent to the third gate. This isolation region can segment the elongated semiconductor body into two semiconductor bodies and, particularly, a first semiconductor body for the first FET and a second semiconductor body for the second FET, and can electrically isolate the first semiconductor body from the second semiconductor body.

To form the isolation region, an opening can be formed that extends through a portion of the third gate and further through a corresponding portion of the elongated semiconductor body adjacent to that third gate in order to physically segment the elongated semiconductor body into two discrete semiconductor bodies (i.e., into the first semiconductor body and the second semiconductor body). Then, at least one isolation layer can be deposited, filling the opening such that the isolation layer is positioned laterally between and immediately adjacent to the first semiconductor body and the second semiconductor body.

Alternatively, to form the isolation region, an opening can be formed that extends through a portion of the third gate so as to expose a corresponding portion of the elongated semiconductor body adjacent to that third gate. Next, a dopant implantation process can be performed in order to form a dopant implant region in the exposed corresponding portion of the elongated semiconductor body. Then, at least one isolation layer can be deposited, filling the opening. In this case, the isolation layer within the opening and the dopant implant region in the corresponding portion of the elongated semiconductor body, in combination, form the isolation region that electrically isolates the first semiconductor body from the second semiconductor body.

Following formation of the isolation region, additional processing can be performed to complete the FETs. This additional processing can include, but is not limited to, interlayer dielectric deposition and formation of contacts to the various components of the FETs (e.g., to the first and second gates of the first and second FETs, respectively).

Also disclosed herein a semiconductor structure that comprises multiple field effect transistors (FETs) and that is formed according to the second method described above. The semiconductor structure can comprise an elongated semiconductor body. Multiple gates (e.g., replacement metal gates) can traverse the elongated semiconductor body. These multiple gates can comprise at least a first gate for a first FET, a second gate for a second FET and a third gate between the first gate and the second gate.

The semiconductor structure can further comprise an isolation region that extends through a portion of the third gate and further through a corresponding portion of the elongated semiconductor body immediately adjacent to the third gate. This isolation region can segment the elongated semiconductor body into two semiconductor bodies and, particularly, into a first semiconductor body for the first FET and a second semiconductor body for the second FET, and can electrically isolate the first semiconductor body from the second semiconductor body.

The isolation region can, for example, comprise an opening that extends through the portion of the third gate and further through the corresponding portion of the elongated semiconductor body adjacent to that third gate such that it physically segments the elongated semiconductor body into two discrete semiconductor bodies (i.e., the first semiconductor body and the second semiconductor body). Additionally, at least one isolation layer can fill the opening such that the isolation layer is positioned laterally between and immediately adjacent to the first semiconductor body and the second semiconductor body.

Alternatively, the isolation region can comprise an opening that extends through a portion of the third gate and exposes a corresponding portion of the elongated semiconductor body adjacent to the third gate. The isolation region can further comprise a dopant implant region, which is in the corresponding portion of the elongated semiconductor body and which effectively segments the elongated semiconductor body into the first semiconductor body and second semiconductor body. At least one isolation layer can fill the opening. In this case, the isolation layer within the opening and the dopant implant region in the corresponding portion of the elongated semiconductor body, in combination, form the isolation region that electrically isolates the first semiconductor body from the second semiconductor body.

The semiconductor structure can further comprise an interlayer dielectric over the first and second FETs and contacts extending vertically through the interlayer dielectric to the various components of the FETs (e.g., to the first and second gates of the first and second FETs, respectively).

BRIEF DESCRIPTION OF THE SEVERAL VIEWS OF THE DRAWINGS

The present invention will be better understood from the following detailed description with reference to the drawings, which are not necessarily drawn to scale and in which.

DETAILED DESCRIPTION

Figure 1:
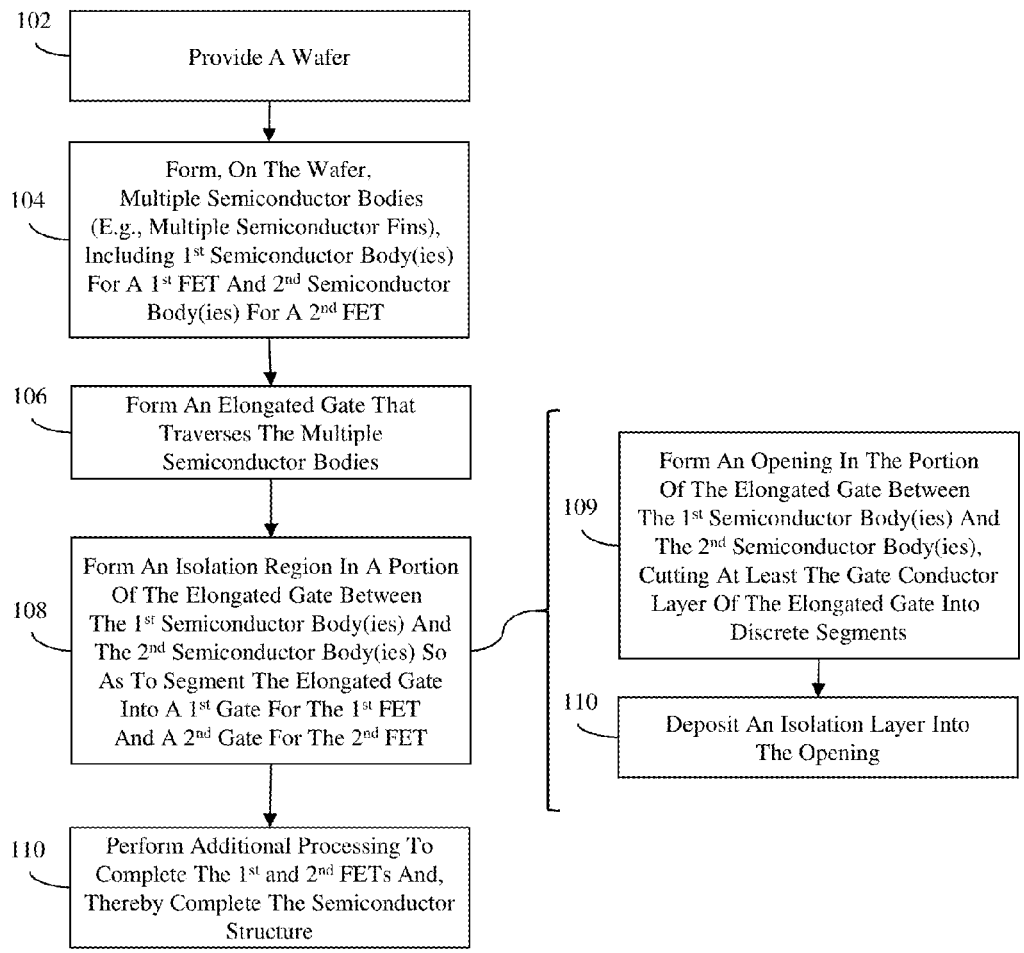
FIG. 1 is a flow diagram illustrating a method of forming a semiconductor structure comprising multiple field effect transistors.

As mentioned above, generally, at least one goal for designing new integrated circuits is to increase device density. However, with conventional methods of forming field effect transistors (FETs), the ability to increase device density is limited due to requirements for gate-to-gate spacing as well as semiconductor body-to-semiconductor body spacing.

Specifically, in conventional FET processing, a gate is formed adjacent to at least one channel region within at least one semiconductor body. In the case of a planar FET, the semiconductor body can comprise a planar semiconductor body defined by a trench isolation region and the gate can be positioned on the top surface of that planar semiconductor body. Alternatively, in the case of a multi-gate non-planar FET (MUGFET), such as a fin-type FET (finFET) (also referred to herein as a dual-gate FET) or a tri-gate FET, the semiconductor body can comprise a non-planar semiconductor body (i.e., a three-dimensional rectangular-shaped semiconductor body, also referred to herein as a fin-shaped semiconductor body or a semiconductor fin) and the gate can be positioned on the opposing sides and over the top of that non-planar semiconductor body.

Final gate structures are gate structures that remain present as active components of FETs following FET processing. Final gates can be formed relatively earlier during FET processing. For example, a final gate comprising a dielectric layer-conductor layer (e.g., polysilicon layer) gate stack can be formed adjacent to a channel region within a semiconductor body, prior to dopant implantation processes used to form source/drain extension regions, halo regions, deep source/drain regions, etc. on opposing sides of the channel region. Alternatively, a final gate can be formed relatively late during FET processing. For example, a dummy gate (also referred to herein as a sacrificial gate, a non-active gate, or a non-gate) can be formed adjacent to a channel region within a semiconductor body, prior to dopant implantation processes used to form source/drain extension regions, halo regions, deep source/drain regions, etc. on opposing sides of the channel region(s). Following the dopant implantation processes as well as additional processes (e.g., inter-layer dielectric deposition and chemical mechanical polishing (CMP) to expose the dummy gate), the dummy gate can be removed and the final gate can be formed in its place as a replacement gate.

Whether the final gates are formed relatively early or relatively late during FET processing, the various process steps performed during and/or following final gate formation can lead to shorting between adjacent gates and, particularly, between gates in end-to-end alignment, the final gates must be formed so as to meet fixed minimum predetermined spacing requirements. For similar reasons, adjacent semiconductor bodies (e.g., semiconductor bodies, such as semiconductor fins, in end-to-end alignment) must also be formed so as to meet fixed minimum spacing requirements. Therefore, there is a need in the art for improved methods of forming FETs that allow the spacing between gates and/or the spacing between semiconductor bodies to be decreased and that, thereby allow for an increase in device density.

In view of the foregoing, disclosed herein are methods of forming semiconductor structures comprising multiple field effect transistors (FETs). These methods each use a gate cut process following final gate formation in order to allow for an increase in device density. For example, in one method, an elongated gate (e.g., an elongated replacement metal gate) can be formed across at least two semiconductor bodies, including a first semiconductor body for a first FET and a second semiconductor body for a second FET. Then, an opening can be formed that extends vertically into a portion of the elongated gate between the two semiconductor bodies, cutting at least the gate conductor layer of the elongated gate. This opening can be filled with an isolation layer so as to form an isolation region that effectively segments the elongated gate into a first gate for the first FET and a second gate for the second FET and that electrically isolates the first gate from the second gate. In another method, multiple gates (e.g., replacement metal gates), including a first gate for a first FET, a second gate for a second FET and a third gate between the first and second gates, can be formed across an elongated semiconductor body. Then, an isolation region can be formed that extends through a portion of the third gate and further through a corresponding portion of the elongated semiconductor body adjacent to the third gate. This isolation region can effectively segment the elongated semiconductor body into two discrete semiconductor bodies for the first FET and the second FET, respectively, and can electrically isolate those semiconductor bodies. Also disclosed are the semiconductor structures resulting from these methods.

Figure 2A:
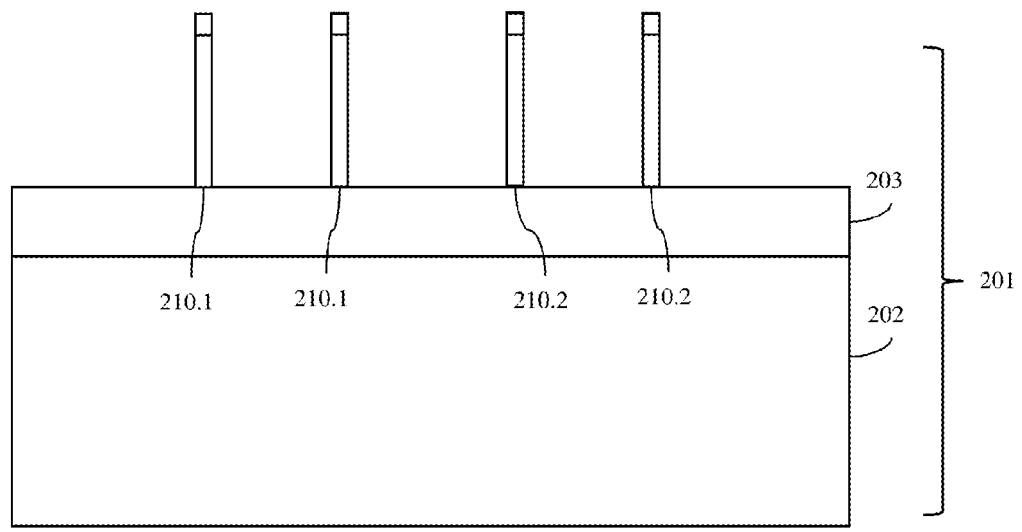
FIG. 2A is a cross-section view diagram illustrating a partially completed semiconductor structure formed according to the method of FIG. 1.
Figure 2B:
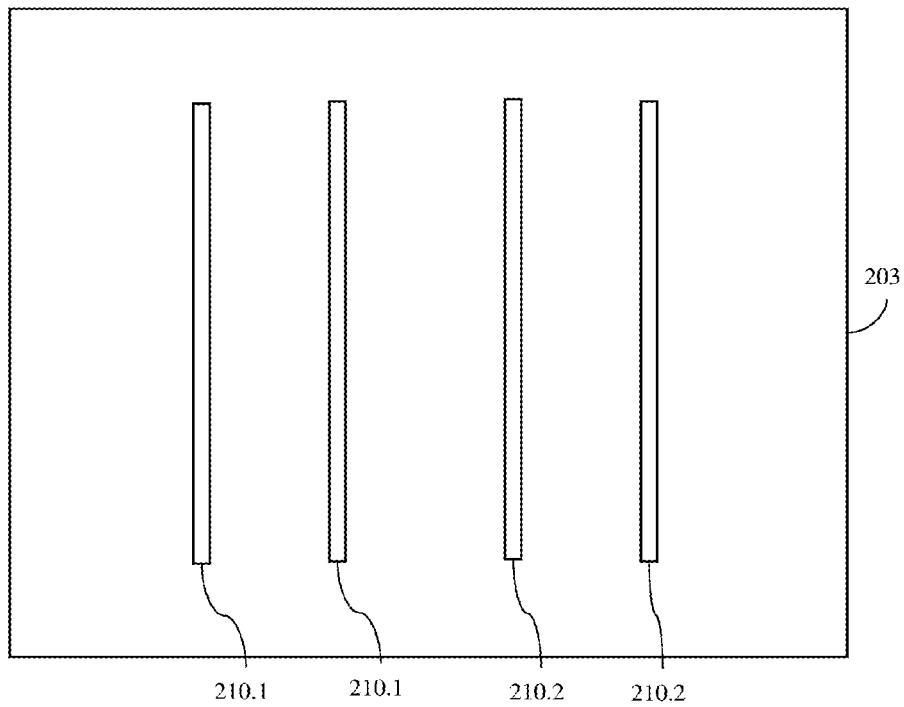
FIG. 2B is a top view diagram illustrating the same partially completed semiconductor structure shown in FIG. 2A.

More particularly, referring to FIG. 1, disclosed herein is a first method of forming a semiconductor structure comprising multiple field effect transistors (FETs), wherein a gate cut process is used following final gate formation in order to allow for an increase in device density. Specifically, this first method can comprise providing a wafer 201 and forming, on that wafer 201, multiple semiconductor bodies 210 for the multiple FETs (102, see FIGS. 2A-2B).

The wafer 201 can comprise, for example, a semiconductor-on-insulator (SOI) wafer. This SOI wafer can comprise a semiconductor substrate 202 (e.g., a silicon substrate or any other suitable bulk semiconductor substrate, such as a germanium substrate, a gallium arsenide substrate, a gallium nitride substrate, etc.), an insulator layer 203 (e.g., a silicon dioxide layer, a silicon nitride layer, a silicon oxynitride layer or any other suitable insulator layer) on the semiconductor substrate 202 and a semiconductor layer on the insulator layer 203. In this case, the multiple semiconductor bodies 210 can be formed in the semiconductor layer such that they are electrically isolated from the semiconductor substrate 202 by the insulator layer 203.

Alternatively, the wafer 201 can comprise a bulk semiconductor substrate such as a bulk silicon substrate or any other suitable bulk semiconductor substrate (e.g., a bulk germanium substrate, a bulk gallium arsenide substrate, a bulk gallium nitride substrate, etc.). In this case, the multiple semiconductor bodies 210 can be formed in an upper portion of the bulk semiconductor substrate and, optionally, either before or after the multiple semiconductor bodies 210 are formed, at least one insulator region (e.g., one or more well regions, one or more trench isolation regions, etc.) can be formed within the bulk semiconductor substrate using conventional processing techniques so as to electrically isolate the multiple semiconductor bodies 210 from a lower portion of the bulk semiconductor substrate.

For purposes of illustration, additional process steps of this first method will be described and illustrated in the Figures with respect to a partially completed semiconductor structure that is formed on an SOI wafer. However, it should be understood that the description and Figures are not intended to be limiting and that similar process steps can be employed when forming a semiconductor structure on a bulk semiconductor wafer.

Those skilled in the art will recognize that the shapes of the semiconductor bodies 210 and the techniques used to form the semiconductor bodies 210 will vary depending upon whether the multiple FETs being formed are to be planar FETs or multi-gate non-planar FETs (MUGFETs). For example, for planar FETs, multiple planar semiconductor bodies can be defined in the semiconductor layer (or upper portion of the bulk semiconductor substrate, if applicable) by forming a shallow trench isolation (STI) region (e.g., using conventional STI processing techniques). For multi-gate non-planar FETs (MUGFETs), such as fin-type FETs (finFETs) (also referred to herein as dual gate FETs) or tri-gate FETs, multiple non-planar semiconductor bodies (e.g., multiple fin-shaped semiconductor bodies, also referred to herein as multiple semiconductor fins) can be defined in the semiconductor layer (or upper portion of the bulk semiconductor substrate, if applicable) using conventional lithographic patterning and etch techniques or sidewall image transfer (SIT) techniques. Those skilled in the art will recognize that the dimensions of non-planar semiconductor bodies and whether or not they remain capped with a dielectric will vary depending upon whether the MUGFETs being formed are finFETs or tri-gate FETs. Techniques for forming both planar and non-planar semiconductor bodies are well known in the art and, thus, the details are omitted from this specification in order to allow the reader to focus on the salient aspects of the disclosed method.

For purposes of illustration, additional process steps of the first method will be described and illustrated in the Figures with respect to a partially completed semiconductor structure that comprises non-planar semiconductor bodies (i.e., fin-shaped semiconductor bodies or semiconductor fins), which are relatively thin and capped with a dielectric, for use in forming finFETs. However, it should be understood that the description and Figures are not intended to be limiting and that similar process steps can be employed following formation of planar semiconductor bodies for use in forming planar FETs or following formation of non-planar semiconductor bodies, which are relatively thick and uncapped, for use in forming tri-gate FETs.

In any case, the multiple semiconductor bodies 210 can be formed at process 104 so as to comprise one or more first semiconductor bodies 210.1 for a first FET and one or more second semiconductor bodies 210.2 for a second FET. The first semiconductor body(ies) 210.1 can be parallel and adjacent to the second semiconductor body(ies) 210.2 (see FIGS. 2A-2B).

Subsequently, an elongated gate 230, which is laterally surrounded by a gate sidewall spacer 220, can be formed so that it traverses the multiple semiconductor bodies 210 (106, see FIG. 3A to FIG. 7B). This elongated gate 230 will remain present in the resulting semiconductor structure. That is, the elongated gate 230 will be a final gate structure. The elongated gate 230 formed at process 106 is referred to as "elongated" because it is larger and, particularly, significantly longer than what is necessary for either the first or second FETs such that it can subsequently be segmented, as described in greater detail below, during a gate cut process in order to form first and second gates, respectively, for the first and second FETs.

The elongated gate formed at process 106 can comprise, for example, a replacement gate (e.g., a replacement metal gate). Those skilled in the art will recognize that a "replacement gate" refers to a gate, which replaces a previously formed dummy gate (also referred to herein as a sacrificial gate, a non-active gate, or a non-gate) and becomes an active component the semiconductor structure being formed. To form such a replacement gate, following formation of the semiconductor bodies 210 and before the elongated gate is formed, a dummy gate 221 can be formed that traverses channel regions 211 of the multiple semiconductor bodies 210 (see FIGS. 3A-3B). To form such a dummy gate 221, a blanket dummy gate material layer (e.g., a silicon layer, a polysilicon layer, or an amorphous silicon layer) can be deposited over the multiple semiconductor bodies 210. This dummy gate material layer can then be lithographically patterned and etched so as to expose source/drain regions 212 in the semiconductor bodies 210 and cover the channel regions 211 positioned laterally between the source/drain regions 212.

Figure 3A:
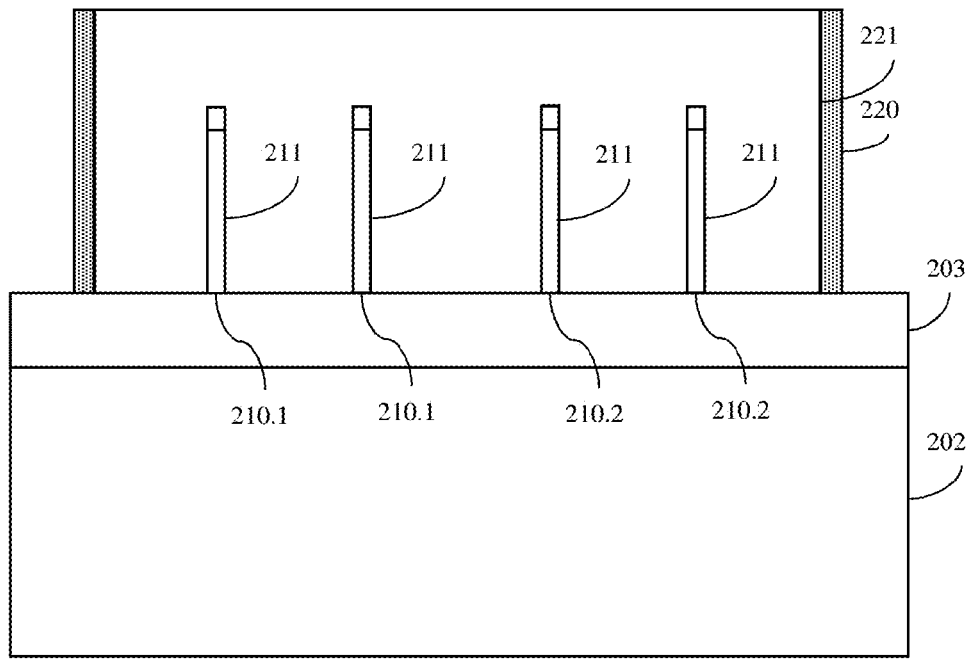
FIG. 3A is a cross-section view diagram illustrating a partially completed semiconductor structure formed according to the method of FIG. 1.
Figure 3B:
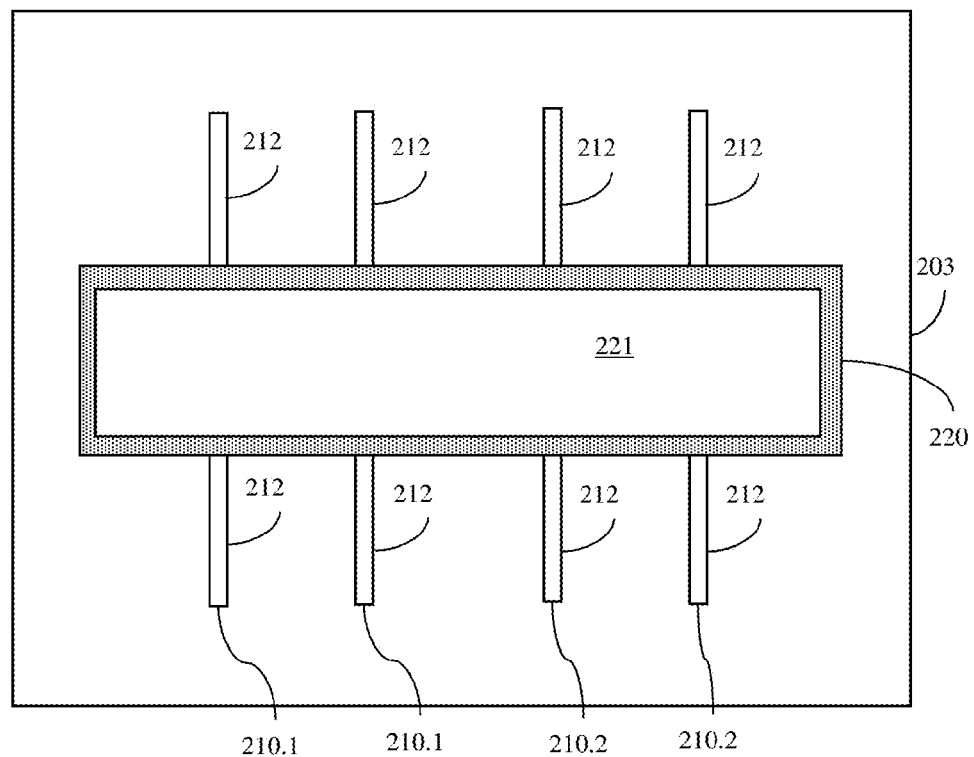
FIG. 3B is a top view diagram illustrating the same partially completed semiconductor structure shown in FIG. 3A.

Following formation of the dummy gate 221, a gate sidewall spacer 220 can be formed adjacent to the vertical sidewalls of the dummy gate 221 so that the gate sidewall spacer 220 laterally surrounds the dummy gate 221 (see FIGS. 3A-3B). The gate sidewall spacer 220 can comprise, for example, one or more dielectric layers comprising any of silicon dioxide, silicon nitride, silicon oxynitride, air-gaps, etc. and can be formed using conventional sidewall spacer formation techniques. For example, a dielectric layer can be deposited over the dummy gate 221 and an anisotropic etch process can be performed in order to remove the dielectric layer from horizontal surfaces such that the resulting gate sidewall spacer 220 remains only on the vertical sidewalls of the dummy gate 221.

Figure 4:
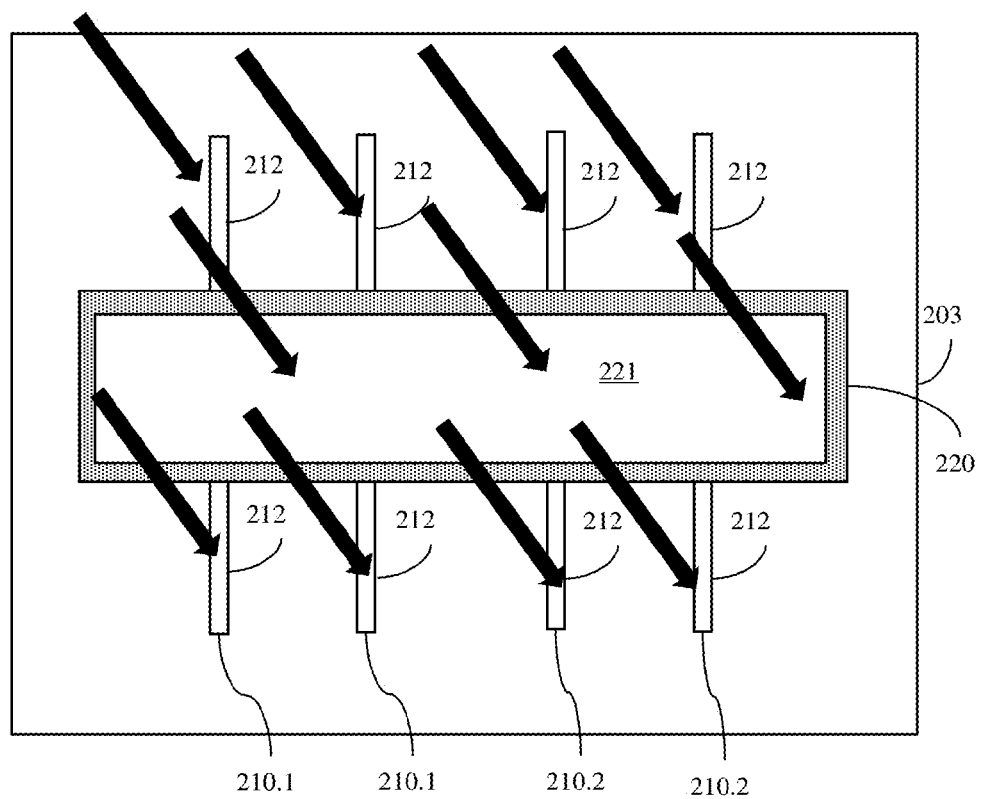
FIG. 4 is a top view diagram illustrating a partially completed semiconductor structure during a dopant implantation process performed according to the method of FIG. 1.
Figure 5:
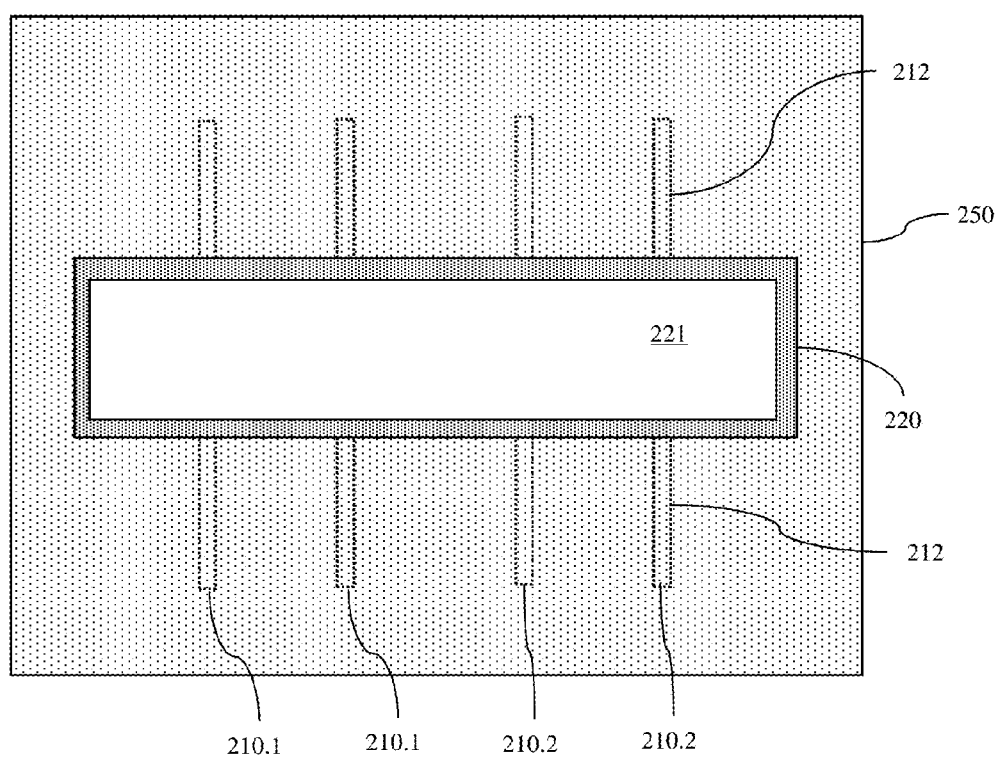
FIG. 5 is a top view diagram illustrating a partially completed semiconductor structure formed according to the method of FIG. 1.

After the dummy gate 221 and gate sidewall spacer 220 are formed, at least one dopant implantation process can be performed so as to at least dope the source/drain regions 212 in the exposed portions of the semiconductor bodies 210 (see FIG. 4). It should be understood that additional dopant implantation processes can be performed before and/or after the formation of the dummy gate 221 and gate sidewall spacer 220 in order to dope additional regions in the semiconductor bodies 210 for the first FETs and/or second FETs (e.g., source/drain extension regions, halo regions, etc.).

It should be understood that the first and second FETs being formed according to this method can be the same type FETs (e.g., all N-type FETs or all P-type FETs) or different type FETs. Those skilled in the art will recognize that different types of dopants can be used to dope the source/drain regions 212 in order to form N-type FETs or P-type FETs. For example, the source/drain regions of N-type FETs can be doped with an N-type dopant, whereas the source/drain regions of P-type FETs can be doped with a P-type dopant. The N-type or P-type dopants will vary depending upon the different semiconductor materials used. For example, a silicon-based semiconductor material can be doped with arsenic (As), phosphorous (P) or antimony (Sb) so as to have N-type conductivity or can be doped with boron (B), boron difluoride ($BF_2$) or indium (In) so as to have P-type conductivity. In another example, a gallium arsenide (GaAs) or gallium nitride (GaN)-based semiconductor material can be doped with silicon (Si) so as to have N-type conductivity or can be doped with magnesium (Mg) or beryllium (Be) so as to have P-type conductivity. Those skilled in the art will also recognize that the higher the concentration of the particular dopant used, the higher the conductivity level associated with that dopant and vice versa. Furthermore, the different conductivity types and levels will depend upon the relative concentration levels of different type dopants in the same region. In any case, if the first and second FETs being formed are to be different type FETs, multiple masked dopant implantation processes can be used to dope the source/drain regions 212, as necessary.

Subsequently, a blanket dielectric layer 250 (e.g., a silicon dioxide layer, a silicon nitride layer, a silicon oxynitride layer or any other suitable dielectric layer) can be formed over the dummy gate 221, the gate sidewall spacer 220 and the exposed portions of the multiple semiconductor bodies 210 (e.g., the source/drain regions 212). This dielectric layer 250 can be planarized (e.g., using a conventional chemical mechanical polishing (CMP) process) so as to expose the top surface of the dummy gate 221 (see FIG. 5).

Figure 6:
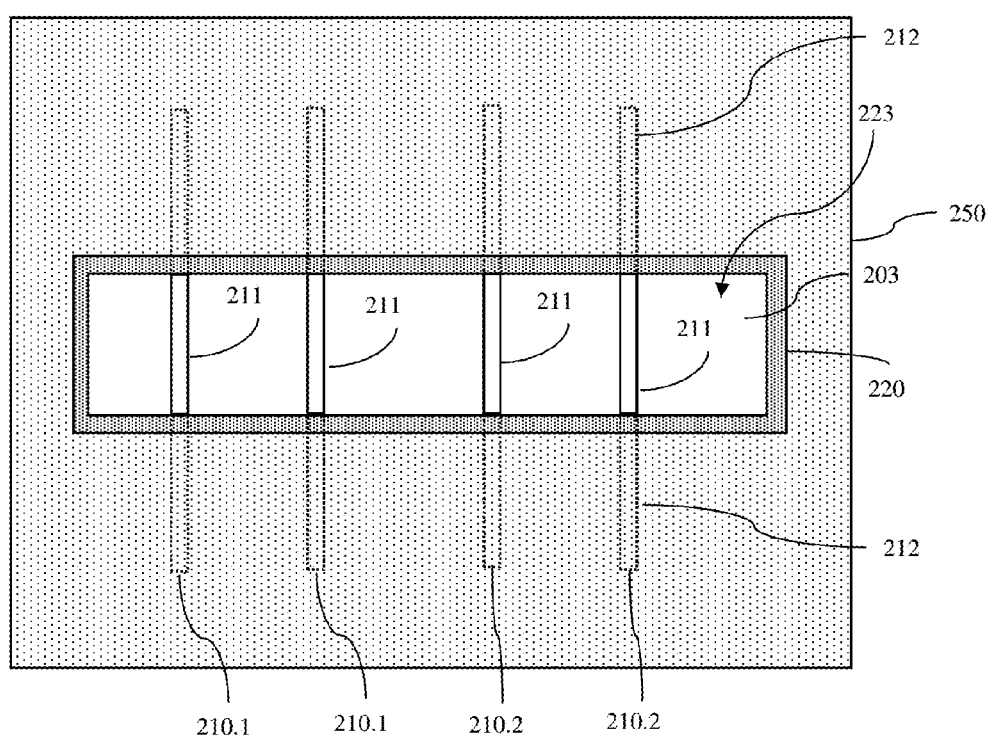
FIG. 6 is a top view diagram illustrating a partially completed semiconductor structure formed according to the method of FIG. 1.
Figure 7A:
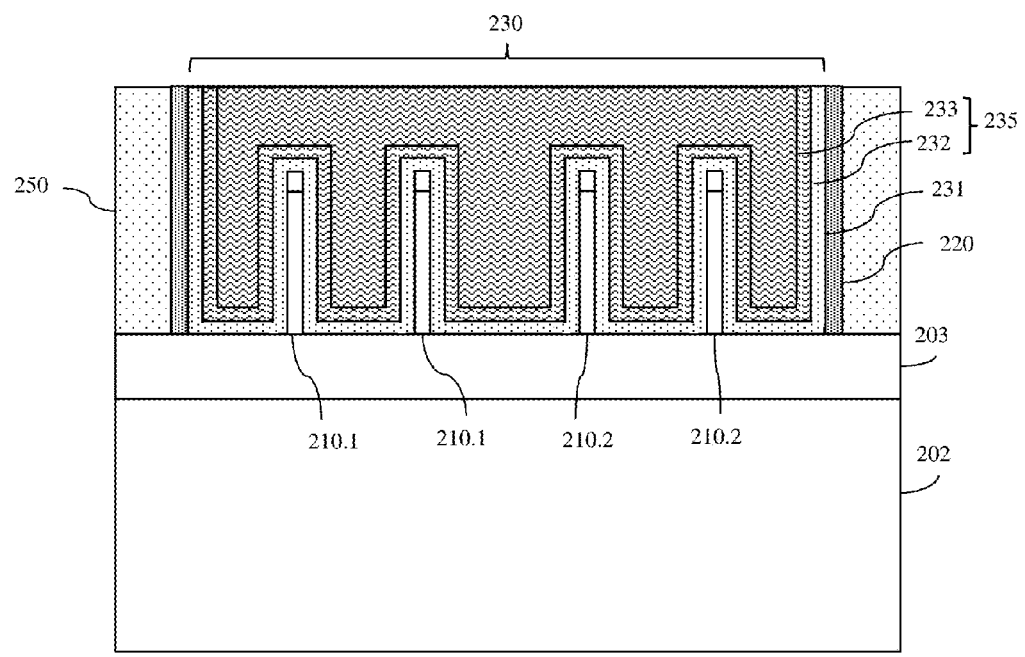
FIG. 7A is a cross-section view diagram illustrating a partially completed semiconductor structure formed according to the method of FIG. 1.
Figure 7B:
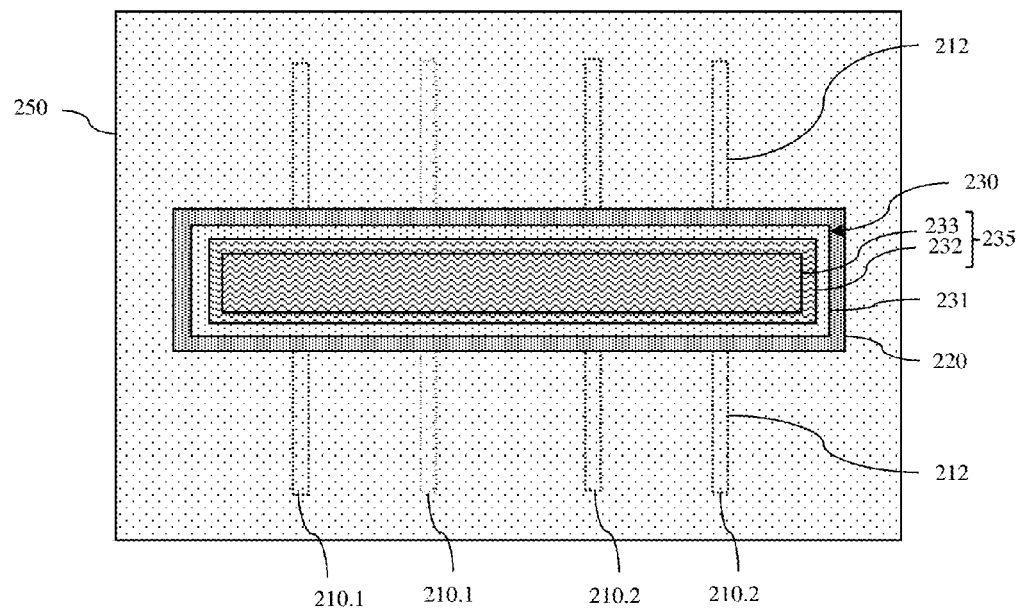
FIG. 7B is a top view diagram illustrating the same partially completed semiconductor structure shown in FIG. 7A.

Once the dummy gate 221 is exposed, it can be selectively removed using, for example, an etch process that is selective for the dummy gate material over the materials used for the dielectric layer 250 and gate sidewall spacer 220 (see FIG. 6). Removal of the dummy gate 221 creates a trench 223 that exposes the channel regions 211 of the multiple semiconductor bodies 210 and, particularly, the channel regions 211 of both the first semiconductor body(ies) 210.1 and the second semiconductor body(ies) 210.2. It should be understood that, when the first and second semiconductor bodies 210.1-210.2 are non-planar semiconductor bodies (e.g., fin-shaped semiconductor bodies, also referred to herein as semiconductor fins), as shown, the tops and opposing sidewalls of each semiconductor body at its corresponding channel region 211 will be exposed.

Once the dummy gate 221 is removed, it can be replaced with a replacement gate, thereby forming the elongated gate 230 that is laterally surrounded by the gate sidewall spacer 220.

More specifically, the dummy gate 221 can be replaced with a replacement metal gate (see FIGS. 7A-7B) by forming a conformal high-K gate dielectric layer 231 on exposed vertical and horizontal surfaces within the trench 223. That is, the conformal high-K gate dielectric layer 231 can be formed immediately adjacent to the gate sidewall spacer 220, immediately adjacent to the channel regions 211 of the first and second semiconductor bodies 210.1-210.2 (e.g., in the case of non-planar semiconductor bodies, as shown, on the opposing sidewalls and over the tops of those first and second semiconductor bodies 210.1-210.2 at their corresponding channel regions 211) and immediately adjacent to the material that extends between the semiconductor bodies 210 (e.g., in the case of non-planar semiconductor bodies on an SOI wafer, immediately adjacent to the insulator layer 203 that extends between semiconductor bodies 210, as shown; in the case of planar semiconductor bodies, immediately adjacent to the STI region that extends between semiconductor bodies). This high-K gate dielectric layer 231 can comprise, for example, a hafnium (HO-based dielectric layer (e.g., hafnium oxide, hafnium silicon oxide, hafnium silicon oxynitride, hafnium aluminum oxide, etc.) or some other suitable high-K dielectric layer (e.g., aluminum oxide, tantalum oxide, zirconium oxide, etc.). Next, a gate conductor layer 235, including one or more gate conductor materials, can be formed on the conformal high-K gate dielectric layer 231. For example, a conformal first metal 232 can be formed over the conformal high-K gate dielectric layer 231 and a second metal 233 can be deposited onto the conformal first metal 232 so as to fill the remaining space within the trench 223. The first metal 232 can comprise a metal selected so as to have a specific work function appropriate for a given type FET (e.g., an N-type FET or a P-type FET). For example, for a silicon-based N-type FET, the first metal 232 can comprise, for example, hafnium, zirconium, titanium, tantalum, aluminum, or alloys thereof, such as hafnium carbide, zirconium carbide, titanium carbide, tantalum carbide, or aluminum carbide, so that the first metal 232 has a work function similar to that of N-doped polysilicon. For a silicon-based P-type FET, the first metal 232 can comprise, for example, ruthenium, palladium, platinum, cobalt, or nickel, or a metal oxide (e.g., aluminum carbon oxide or aluminum titanium carbon oxide) or a metal nitride (e.g., titanium nitride, titanium silicon nitride, tantalum silicon nitride, titanium aluminum nitride, or tantalum aluminum nitride) so that the first metal 232 has a work function similar to that of P-doped polysilicon. The second metal 233 can comprise, for example, a metal fill material (e.g., tungsten). Alternatively, any other suitable configuration of metal and/or metal alloys could be used for the gate conductor layer 235.

In any case, forming the elongated gate 230 as a replacement metal gate in this manner results in the conformal high-K gate dielectric layer 231 being positioned between the gate conductor layer 235 and the multiple semiconductor bodies 210 and also between the gate conductor layer 235 and the gate sidewall spacer 220.

Alternatively, the elongated gate formed at process 106 can comprise a conventional gate, which is formed prior to any dopant implantation process(es) used to dope the source/drain regions, etc. of the semiconductor bodies and which is formed without the use of a dummy gate. For example, a gate dielectric layer can be formed by depositing at least one dielectric material (e.g., silicon dioxide, silicon nitride, silicon oxynitride or any other suitable dielectric material) over the semiconductor bodies 210. Then, a gate conductor layer can be formed by depositing at least one gate conductor material (e.g., doped polysilicon or any other suitable gate conductor material) onto the gate dielectric layer. The resulting gate stack can be lithographically patterned and etched into a conventional gate, exposing the source/drain regions within the semiconductor bodies and covering the channel regions that are positioned laterally between the source/drain regions. Next, a gate sidewall spacer can be formed adjacent to the vertical sidewalls of the conventional gate so that the gate sidewall spacer laterally surrounds the conventional gate. As discussed above, such a gate sidewall spacer can comprise, for example, one or more dielectric layers comprising any of silicon dioxide, silicon nitride, silicon oxynitride, air-gaps, etc. and can be formed using conventional sidewall spacer formation techniques. After the conventional gate and gate sidewall spacer are formed, at least one dopant implantation process can be performed so as to at least dope the source/drain regions in the exposed portions of the semiconductor bodies.

For purposes of illustration, additional process steps of this first method will be described and illustrated in the Figures with respect to a partially completed semiconductor structure comprising an elongated gate comprising a replacement metal gate. However, it should be understood that the description and Figures are not intended to be limiting and that similar process steps can be employed following formation of an elongated gate comprising a conventional gate.

In any case, after the elongated gate 230 is formed at process 106, an isolation region 240 can be formed in a portion 249 of the elongated gate 230 that extends laterally between the first semiconductor body(ies) 210.1 and the second semiconductor body(ies) 210.2 (108). To form this isolation region 240, an opening 245 can be formed (e.g., lithographically patterned and etched) so that it is parallel to the first semiconductor body(ies) 210.1 and second semiconductor body(ies) and so that it extends vertically into the portion 249 of the elongated gate 230 between the first semiconductor body(ies) 210.1 and the second semiconductor body(ies) 210.2, thereby cutting at least the gate conductor layer 235 (e.g., including the first and second metals 232-233, if applicable) of the elongated gate 230 into discrete segments 235.1 and 235.2 adjacent to the first semiconductor body(ies) 210.1 and second semiconductor body(ies) 210.2, respectively (109, see FIGS. 8A-8B or FIGS. 9A-9B). The formation of this opening 245 constitutes the gate cut process following final gate formation referred to above.

Figure 8A:
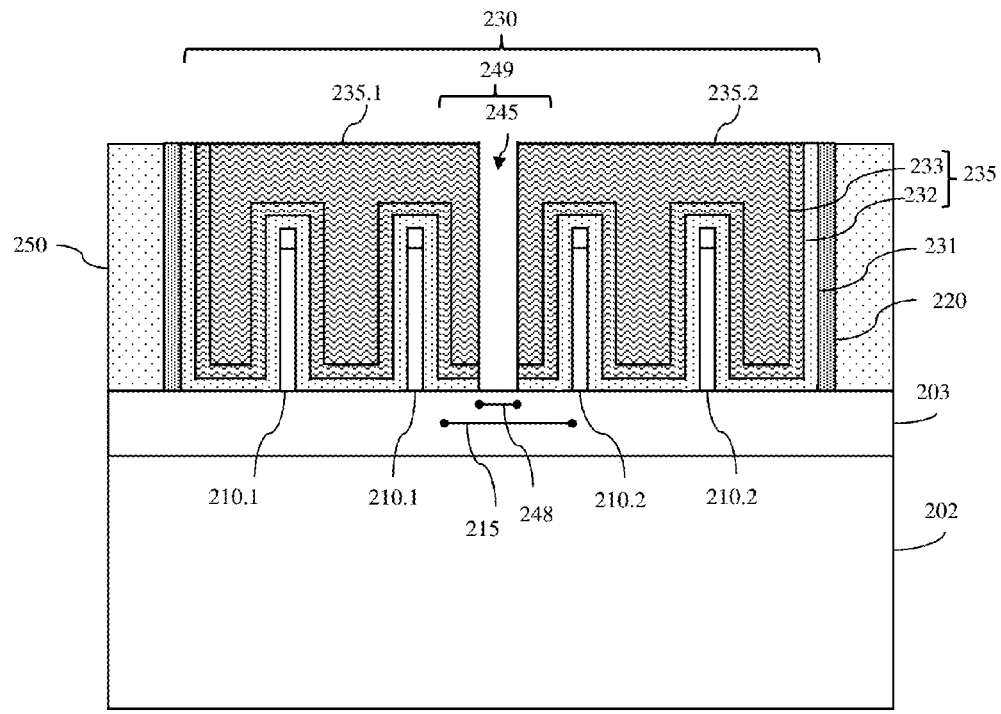
FIG. 8A is a cross-section view diagram illustrating a partially completed semiconductor structure formed according to the method of FIG. 1.
Figure 8B:
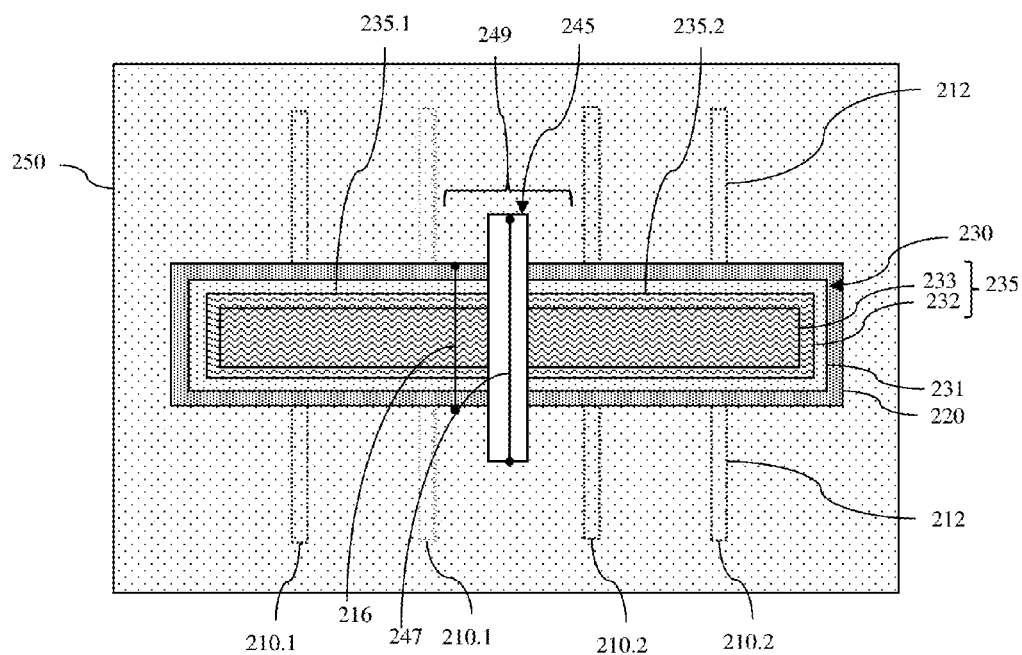
FIG. 8B is a top view diagram illustrating the same partially completed semiconductor structure shown in FIG. 8A.

It should be noted that this opening 245 can be lithographically patterned and etched so that it has a width 248 that is less than the distance 215 between the first semiconductor body(ies) 210.1 and the second semiconductor body(ies) 210.2 and further so that it has a length 247 that completely traverses the portion 249 of the elongated gate 230 (i.e., so that it has a length 247 that is longer than the width 216 of the elongated gate 230) and extends laterally into and through opposing sections of the gate sidewall spacer 220 adjacent to the portion 249 of the elongated gate 230, as shown in FIG. 8B. In this case, the etching process used to form the opening 245 can cut through, not only the gate conductor material, but also the gate dielectric material and the gate sidewall spacer material. This etching process can further stop on the substrate below the portion 249 of the elongated gate 230 (e.g., in the case of non-planar semiconductor bodies on an SOI wafer, on the insulator layer 203 that extends between semiconductor bodies 210, as shown; in the case of planar semiconductor bodies, on the STI region that extends between semiconductor bodies), as shown in FIG. 8A.

Figure 9A:
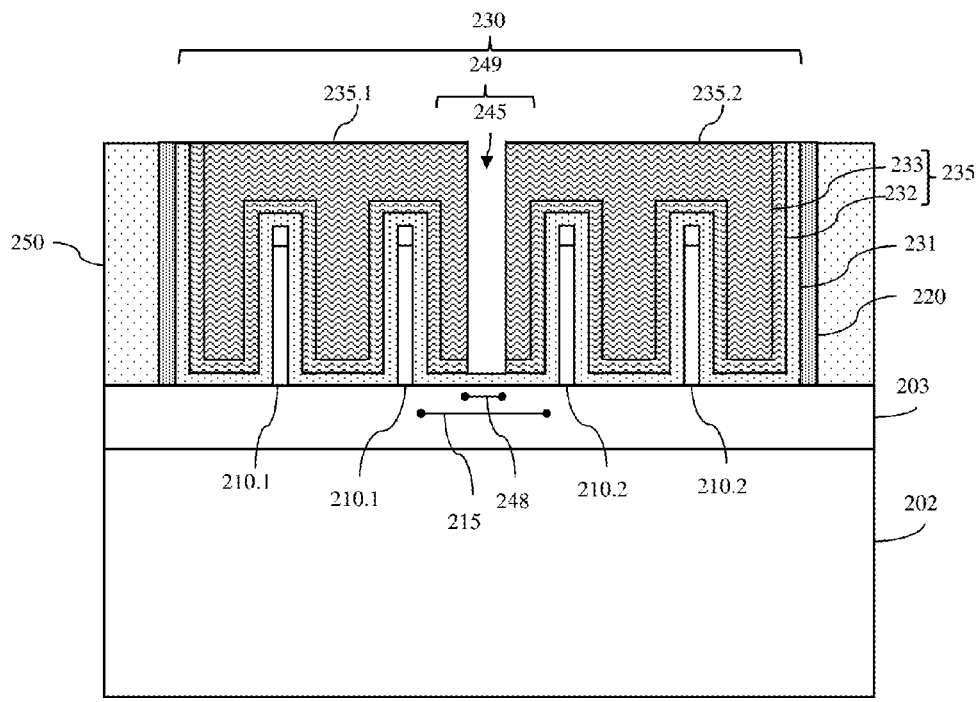
FIG. 9A is a cross-section view diagram illustrating an alternative partially completed semiconductor structure formed according to the method of FIG. 1.
Figure 9B:
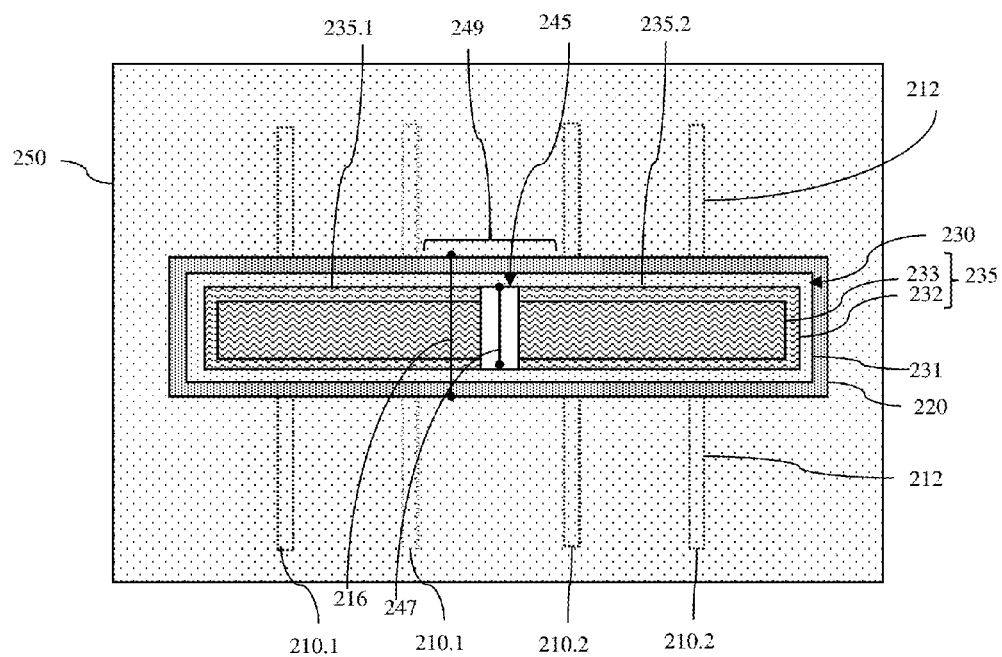
FIG. 9B is a top view diagram illustrating the same alternative partially completed semiconductor structure shown in FIG. 9A.

Alternatively, the opening 245 can be lithographically patterned and etched so that it has a width 248 that is less than the distance 215 between the first semiconductor body(ies) 210.1 and the second semiconductor body(ies) 210.2 and further so that it has a length 247 that is less than the width 216 of the elongated gate 230 and, specifically, that only traverses the gate conductor layer 235 without extending laterally through the gate dielectric layer, if applicable (e.g., in the case of a replacement metal gate) and without extending laterally into opposing sections of the gate sidewall spacer 220 adjacent to the portion 249 of the elongated gate 230, as shown in FIG. 9B. In this case, the etching process used to form the opening 245 can be a selective etch process that cuts through only the gate conductor material and not through gate dielectric material and gate sidewall spacer material. The etching process can further stop on the gate dielectric layer 231, as shown in FIG. 9A.

Figure 10A:
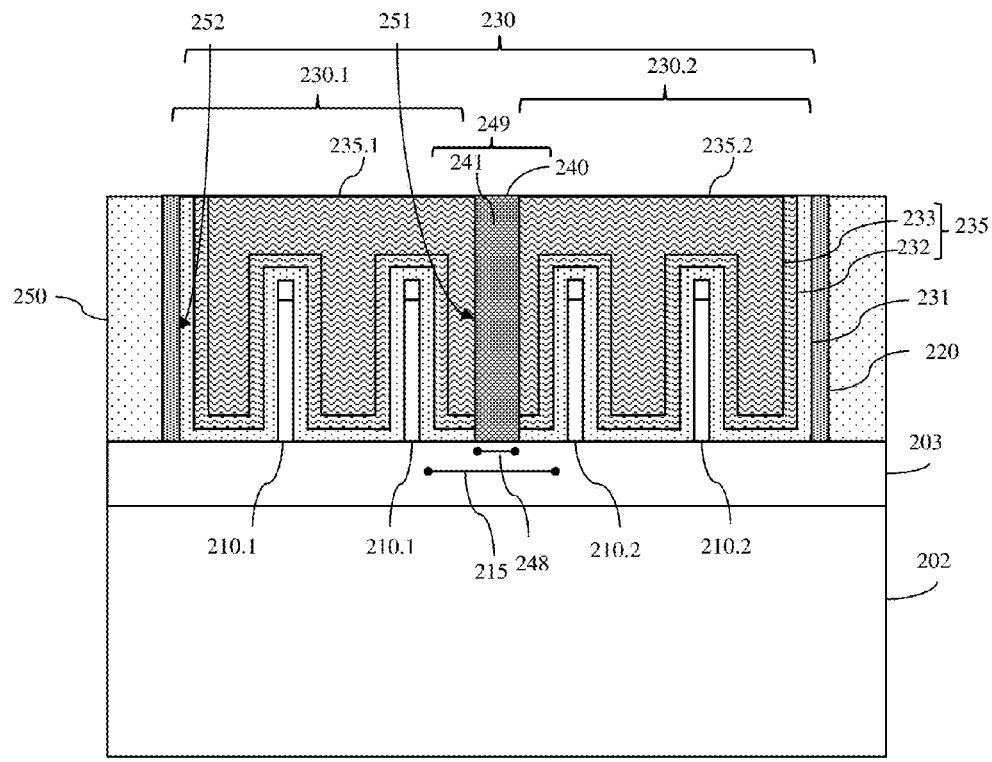
FIG. 10A is a cross-section view diagram illustrating a partially completed semiconductor structure formed according to the method of FIG. 1.
Figure 10B:
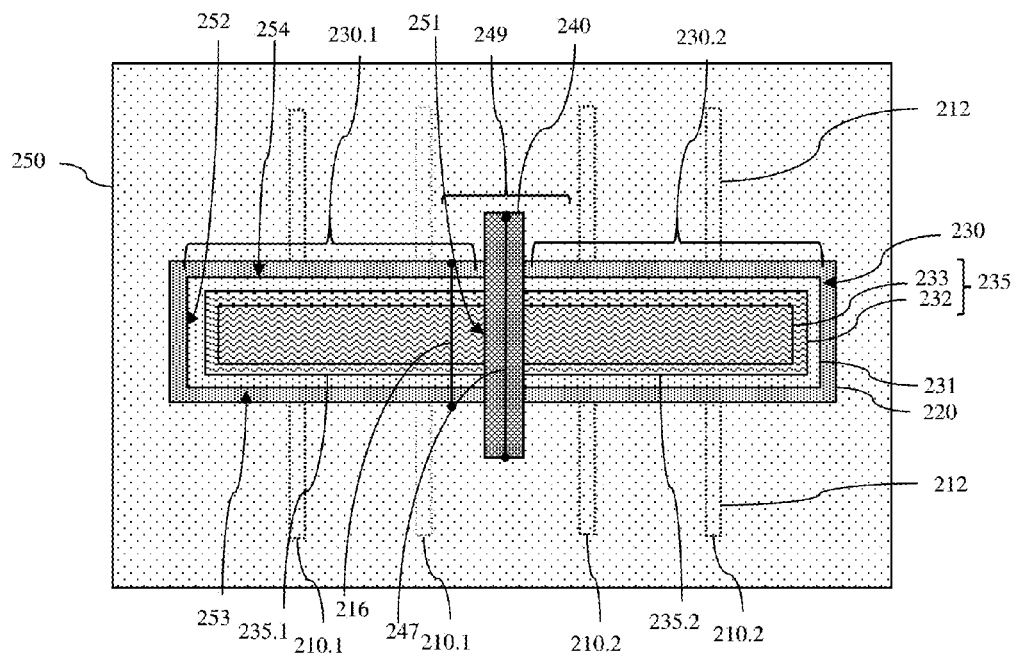
FIG. 10B is a top view diagram illustrating the same partially completed semiconductor structure shown in FIG. 10A.
Figure 11A:
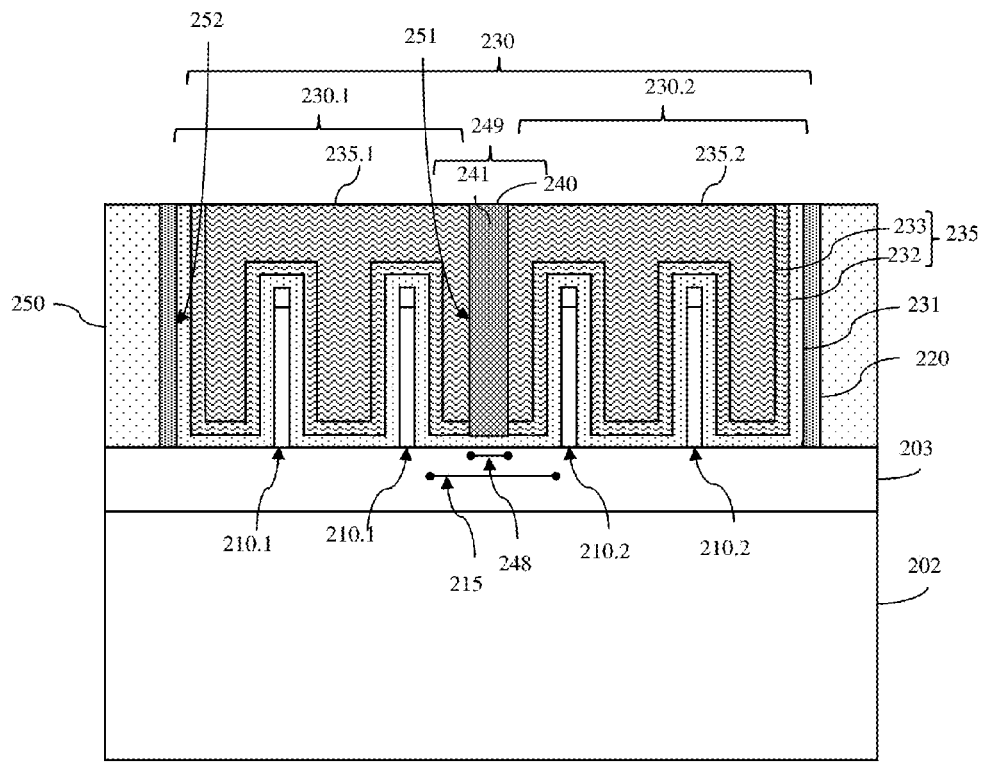
FIG. 11A is a cross-section view diagram illustrating an alternative partially completed semiconductor structure formed according to the method of FIG. 1.
Figure 11B:
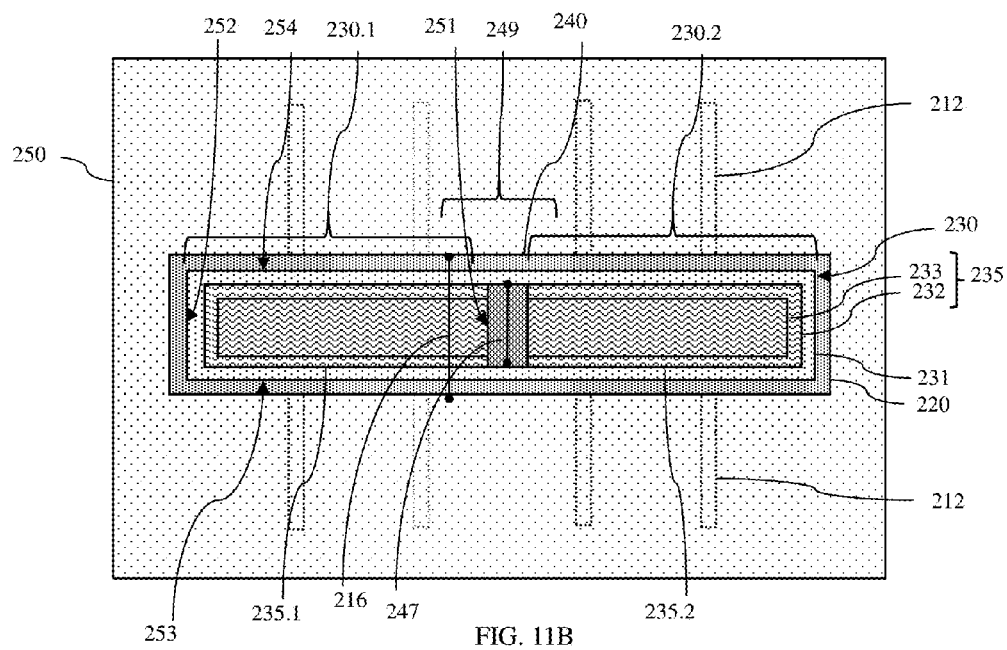
FIG. 11B is a top view diagram illustrating the same alternative partially completed semiconductor structure shown in FIG. 11A.

Then, an isolation layer 241 can be deposited, filling the opening 245 such that the isolation layer 241 is positioned laterally between and immediately adjacent to the discrete segments 235.1 and 235.2 of the gate conductor layer 235, thereby completing the isolation region 240 (110). The isolation layer 241 deposited into the opening 245 to form the isolation region 240 can comprise, for example, a silicon dioxide layer, a silicon nitride layer, a silicon oxynitride layer or any other suitable isolation layer. This isolation layer 241 can comprise, for example, the same material or a different material that than used for the gate sidewall spacer 220 and/or the gate dielectric layer 231. FIGS. 10A-10B illustrate the resulting partially completed semiconductor structure following deposition of an isolation layer 241 into the opening 245 shown in FIGS. 8A-8B. FIGS. 11A-11B illustrate the alternative resulting partially completed semiconductor structure following deposition of an isolation layer 241 into the opening 245 shown in FIGS. 9A-9B. In either case, the resulting isolation region 240 effectively segments the elongated gate 230 into a first gate 230.1 for the first FET and a second gate 230.2 for the second FET and electrically isolates those two gates from each other (i.e., electrically isolates the first gate 230.1 from the second gate 230.2).

By segmenting the elongated gate 230 into first and second gates 230.1-230.2 in this manner, subsequent processing-induced shorting between two gates, which are in end-to-end alignment, is minimized. Consequently, the spacing requirements necessary to avoid shorting between such gates can be reduced and device density can be increased.

Figure 12:
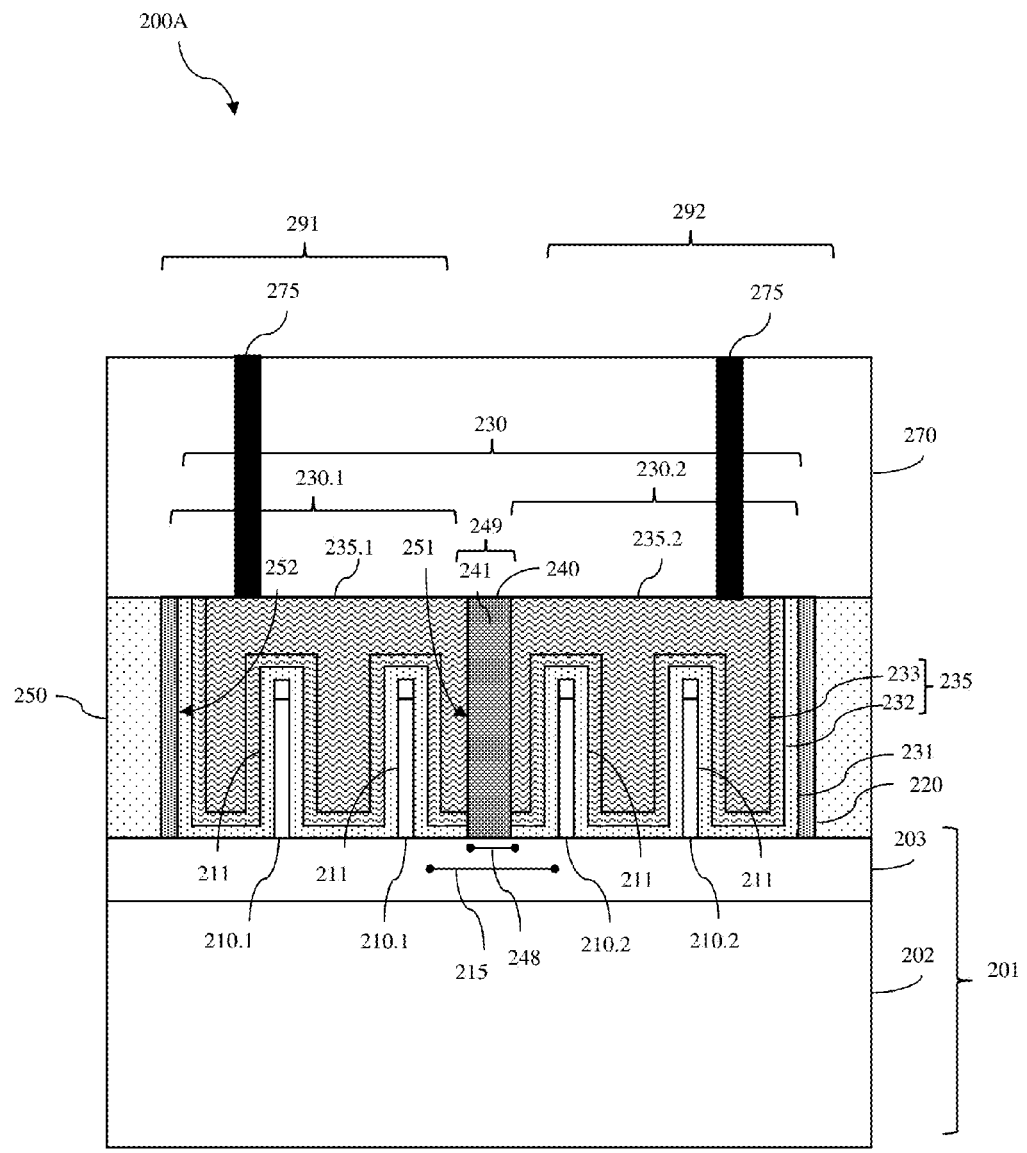
FIG. 12 is a cross-section view diagram illustrating a completed semiconductor structure formed according to the method of FIG. 1.
Figure 13:
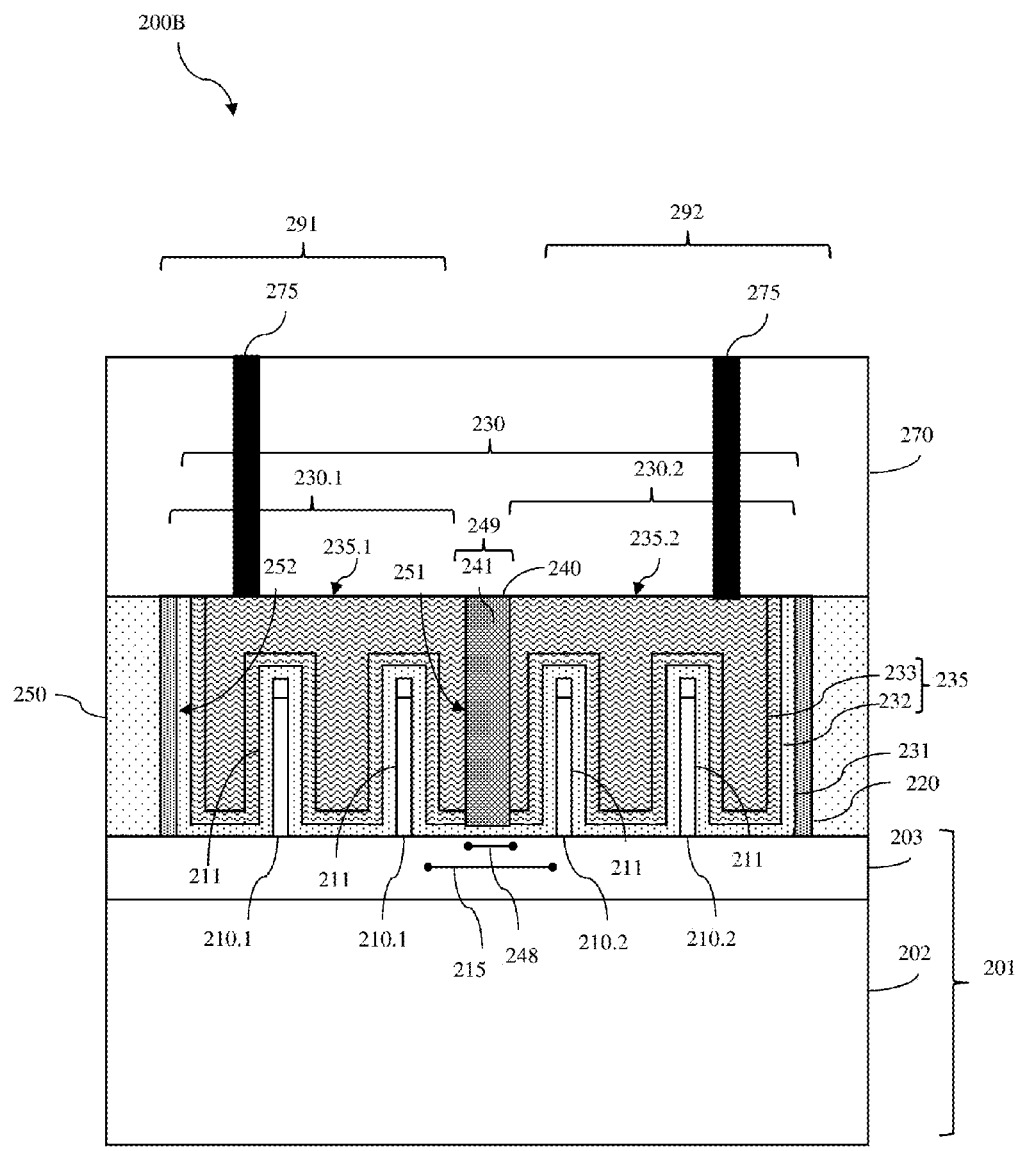
FIG. 13 is a cross-section view diagram illustrating an alternative completed semiconductor structure formed according to the method of FIG. 1.

Following formation of the isolation region 240 in the elongated gate 230 at process 108, additional processing can be performed on the partially completed semiconductor structures shown in FIGS. 10A-10B and FIGS. 11A-11B in order to complete the semiconductor structures 200A and 200B, respectively, each comprising a first FET 291 and a second FET 292 (110, see FIG. 12 and FIG. 13). This additional processing can include, but is not limited to, deposition of one or more interlayer dielectrics 270 and formation of contacts 275 through the interlayer dielectric(s) 270 to the various components of the FETs 291-292 (e.g., to the first and second gates 230.1 and 230.2 of the first and second FETs 291 and 292, respectively). Techniques and materials used during interlayer dielectric deposition and contact formation are well known in the art and, thus, the details have been omitted from this specification in order to allow the reader to focus on the salient aspects of the disclosed method.

Thus, also disclosed herein are the semiconductor structure 200A, as shown in FIG. 12 (see also FIG. 10B) and the semiconductor structure 200B, as shown in FIG. 13 (see also FIG. 11B), each of which are formed according to the method described above and illustrated in the flow diagram of FIG. 1. Each of these semiconductor structures 200A and 200B can comprise multiple field effect transistors (FETs) comprising multiple semiconductor bodies and, particularly, a first FET 291 and a second FET 292 comprising first semiconductor body(ies) 210.1 and second semiconductor body(ies) 210.2, respectively.

The semiconductor structures 200A-200B can comprise semiconductor-on-insulator (SOI) structures formed on an SOI wafer. That is, the semiconductor structures 200A-200B can each comprise a semiconductor substrate 202, an insulator layer 203 on the semiconductor substrate 202 and multiple semiconductor bodies 210.1-210.2 formed from a semiconductor layer above the insulator layer 203. Alternatively, the semiconductor structures 200A-200B can comprise bulk semiconductor structures formed on a bulk semiconductor wafer. That is, the semiconductor structures 200A-200B can each comprise a bulk semiconductor substrate and multiple semiconductor bodies 210.1-210.2 formed from an upper portion of the bulk semiconductor substrate and electrically isolated from a lower portion of the semiconductor substrate (e.g., by one or more well regions, one or more trench isolation regions, etc.).

For purposes of illustration, the semiconductor structures 200A and 200B are illustrated as SOI structures. However, it should be understood that the description and Figures are not intended to be limiting and that the additional features of the semiconductor structures 200A and 200B described below can also be present in similar bulk semiconductor structures.

Those skilled in the art will recognize that the shapes of the multiple semiconductor bodies 210.1-210.2 will vary depending upon whether the first and second FETs 291-292 are planar FETs or multi-gate non-planar FETs (MUGFETs). For example, for planar FETs, the multiple semiconductor bodies 210.1-210.2 can comprise multiple planar semiconductor bodies defined by shallow trench isolation (STI) regions. However, for multi-gate non-planar FETs (MUGFETs), such as fin-type FETs (finFETs) (also referred to herein as dual gate FETs) or tri-gate FETs, the multiple semiconductor bodies 210.1-210.2 can comprise multiple non-planar semiconductor bodies (e.g., multiple fin-shaped semiconductor bodies, also referred to herein as multiple semiconductor fins). Those skilled in the art will also recognize that the dimensions of non-planar semiconductor bodies and whether or not they are capped with a dielectric will vary depending upon whether the MUGFETs are finFETs or tri-gate FETs. For finFETs, the non-planar semiconductor bodies will typically be relatively thin and capped with a dielectric cap. For tri-gate FETs, the non-planar semiconductor bodies will typically be relatively wide and uncapped.

For purposes of illustration, the semiconductor structures 200A and 200B are illustrated in the Figures as comprising finFETs comprising non-planar semiconductor bodies, which are relatively thin and capped. However, it should be understood that the description and Figures are not intended to be limiting and that the additional features of the semiconductor structures 200A and 200B described below can also be present in semiconductor structure comprising multiple planar FETs or multiple tri-gate FETs.

In any case, the multiple semiconductor bodies can comprise one or more first semiconductor bodies 210.1 for the first FET 291 and one or more second semiconductor bodies 210.2 for the second FET 292. The first semiconductor body(ies) 210.1 can be parallel and adjacent to the second semiconductor body(ies) 210.2. Each of the semiconductor body(ies) 210.1-210.2 can comprise source/drain regions 212 and a channel region 211 positioned laterally between the source/drain regions 212.

The semiconductor structures 200A and 200B can each further comprise an elongated gate 230 laterally surrounded by a gate sidewall spacer 220 and traversing the multiple semiconductor bodies 210.1-210.2 and, particularly, traversing the channel region 211 of each of the multiple semiconductor bodies 210.1-210.2.

The gate sidewall spacer 220 can comprise, for example, one or more dielectric layers comprising any of silicon dioxide, silicon nitride, silicon oxynitride, air-gaps, etc. and can be formed using conventional sidewall spacer formation techniques.

The elongated gate 230 can comprise a replacement gate (e.g., a replacement metal gate, as illustrated). Such a replacement gate can comprise a conformal high-K gate dielectric layer 231 immediately adjacent to vertical surfaces the gate sidewall spacer 220, immediately adjacent to channel regions 211 of the first and second semiconductor bodies 210.1-210.2 (e.g., in the case of non-planar semiconductor bodies, as shown, on the opposing sidewalls and over the tops of those first and second semiconductor bodies 210.1-210.2 at their corresponding channel regions 211) and immediately adjacent to the material that extends between the semiconductor bodies 210 (e.g., in the case of non-planar semiconductor bodies on an SOI wafer, immediately adjacent to the insulator layer 203 that extends between semiconductor bodies 210, as shown; in the case of planar semiconductor bodies, immediately adjacent to the STI region that extends between semiconductor bodies). This high-K gate dielectric layer 231 can comprise, for example, a hafnium (HO-based dielectric layer (e.g., hafnium oxide, hafnium silicon oxide, hafnium silicon oxynitride, hafnium aluminum oxide, etc.) or some other suitable high-K dielectric layer (e.g., aluminum oxide, tantalum oxide, zirconium oxide, etc.). Such a replacement gate can further comprise a gate conductor layer 235, including one or more gate conductor materials, on the conformal high-K gate dielectric layer 231. For example, the gate conductor layer 235 can comprise a conformal first metal 232 on the conformal high-K gate dielectric layer 231 and a second metal 233 on the conformal first metal 232. The first metal 232 can comprise a metal selected so as to have a specific work function appropriate for a given type FET (see detail discussion of the work function of metals above with regard to the method) and the second metal 233 can comprise, for example, a metal fill material (e.g., tungsten). Alternatively, any other suitable configuration of metal and/or metal alloys could be used for the gate conductor layer 235. In any case, within such a replacement metal gate, the conformal high-K gate dielectric layer 231 will be positioned between the gate conductor layer 235 and the multiple semiconductor bodies 210.1-210.2 and also between the gate conductor layer 235 and the gate sidewall spacer 220.

Alternatively, the elongated gate 230 can comprise a conventional gate (not shown). Such a conventional gate can comprise a gate dielectric layer (e.g., a silicon dioxide layer or other suitable gate dielectric layer) immediately adjacent to channel regions 211 of the first and second semiconductor bodies 210.1-210.2 and immediately adjacent to the material that extends between the semiconductor bodies 210. Such a conventional gate can further comprise a gate conductor layer (e.g., a doped polysilicon layer or other suitable gate conductor layer) on the gate dielectric layer. In such a conventional gate, the gate dielectric layer will be positioned between the gate conductor layer and the multiple semiconductor bodies 210.1-210.2, but not between the gate conductor layer and the gate sidewall spacer.

For purposes of illustration, the semiconductor structures 200A and 200B are illustrated in the Figures as comprising an elongated gate 230 comprising a replacement metal gate. However, it should be understood that the description and Figures are not intended to be limiting and that the additional features of the semiconductor structures 200A and 200B described below can also be present when the elongated gate 230 comprises a conventional gate.

The semiconductor structures 200A and 200B can each further comprise an isolation region 240 in a portion 249 of the elongated gate 230 that extends laterally between the first semiconductor body(ies) 210.1 and the second semiconductor body(ies) 210.2. This isolation region 240 can be parallel to the first semiconductor body(ies) 210.1 and the second semiconductor body(ies) 210.2 and can comprise an opening, which is filled with an isolation layer 241 and which extends vertically into the portion 249 of the elongated gate 230 between the first semiconductor body(ies) 210.1 and the second semiconductor body(ies) 210.2, thereby cutting at least the gate conductor layer 235 (e.g., including the first and second metals 232-233, if applicable) of the elongated gate 230 into discrete segments 235.1 and 235.2, which are adjacent to the first semiconductor body (ies) 210.1 and second semiconductor body(ies) 210.2, respectively. The isolation layer 241 that fills the opening can comprise, for example, a silicon dioxide layer, a silicon nitride layer, a silicon oxynitride layer or any other suitable isolation layer. This isolation layer 241 can comprise, for example, the same material or a different material that than used for the gate sidewall spacer 220 and/or the gate dielectric layer 231.

In the semiconductor structure 200A of FIG. 12 (see also FIG. 10B), this opening and, thereby the isolation region 240 can have a width 248 that is less than the distance 215 between the first semiconductor body(ies) 210.1 and the second semiconductor body(ies) 210.2 and can further have a length 247 that completely traverses the portion 249 of the elongated gate 230 between the first semiconductor body (ies) 210.1 and the second semiconductor body(ies) 210.2 (i.e., that is longer than the width 216 of that portion 249 of the elongated gate 230) and that further extends laterally into and through opposing sections of the gate sidewall spacer 220 adjacent to the portion 249 of the elongated gate 230. The opening and, thereby the isolation region 240 can cut through, not only the gate conductor material, but also the gate dielectric material and the gate sidewall spacer material. Additionally, the opening and, thereby the isolation region 240 can extend in the vertical direction through the gate dielectric layer 231 to the substrate below the portion 249 of the elongated gate 230 (e.g., in the case of non-planar semiconductor bodies on an SOI wafer, to the insulator layer 203, as shown; in the case of planar semiconductor bodies, to an STI region).

Alternatively, in the semiconductor structure 200B of FIG. 13 (see also FIG. 11B), this opening can have a width 248 that is less than the distance 215 between the first semiconductor body(ies) 210.1 and the second semiconductor body(ies) 210.2 and can further have a length 247 that is less than the width 216 of the elongated gate 230 and, specifically, that only traverses the gate conductor layer 235 without extending laterally through the gate dielectric layer 231, if applicable (e.g., in the case of a replacement metal gate) and without extending laterally into opposing sections of the gate sidewall spacer 220 adjacent to the portion 249 of the elongated gate 230. In this case, the opening and, thereby the isolation region 240 cuts through only the gate conductor material and not through gate dielectric material and the gate sidewall spacer material. Additionally, the opening and, thereby the isolation region 240 extends in the vertical direction to, without further extending through, the gate dielectric layer 231.

In each of the semiconductor structures 200A and 200B, the isolation region 240 effectively segments the elongated gate 230 into a first gate 230.1 for the first FET 291 and a second gate 230.2 for the second FET 292 and electrically isolates those two gates from each other (i.e., electrically isolates the first gate 230.1 from the second gate 230.2). Furthermore, while the elongated gate 230 is symmetrical, the first and second gates 230.1 and 230.2 are not (particularly when the elongated gate 230 comprises a replacement metal gate, as shown). That is, the gates 230.1 and 230.2 each have a first end 251 adjacent to the isolation region 240, a second end 252 opposite the first end 251 and opposing sides 253-254. The gate sidewall spacer 220, which laterally surrounds the elongated gate 230, is only positioned laterally adjacent to the opposing sides 253-254 and the second end 252 of each of the gates 230.1 and 230.2. Furthermore, in the case of a replacement metal gate, the high-K gate dielectric layer 231, which is positioned between the gate conductor layer 235 and the gate sidewall spacer 220, is only positioned laterally adjacent to the opposing sides 253-254 and a second end 252 of each of the gates 230.1 and 230.2. The first end 251 of each gate 230.1 and 230.2 is devoid of gate dielectric and gate sidewall spacer material such that the gate conductor layer 235 and, particularly, the discrete segments 235.1 and 235.2 of the gate conductor layer 235 within each gate 230.1 and 230.2, respectively, are immediately adjacent (i.e., in physical contact with) the isolation region 240.

Additional features that complete the semiconductor structures 200A and 200B, respectively, can include, but are not limited to, one or more interlayer dielectrics 270 over the first and second FETs 291-292 and contacts 275 through the interlayer dielectric(s) 270 to the various components of the first and second FETs 291-292 (e.g., to the first and second gates 230.1 and 230.2 of the first and second FETs 291 and 292, respectively). Interlayer dielectrics and contacts are well known in the art and, thus, the details of these features have been omitted from this specification in order to allow the reader to focus on the salient aspects of the disclosed method.

It should be noted that in FIGS. 5, 6, 7B, 8B, 9B, 10B, and 11B, the dielectric layer 250 covers the source/drain regions 212 within the first and second semiconductor bodies 210.1-210.2. Consequently, the source/drain regions 212 would not actually be visible in the top views of the partially completed structures and, thus, they are depicted in the above-mentioned Figures with a dotted line simply to show relative positioning below the dielectric layer 250.

Figure 14:
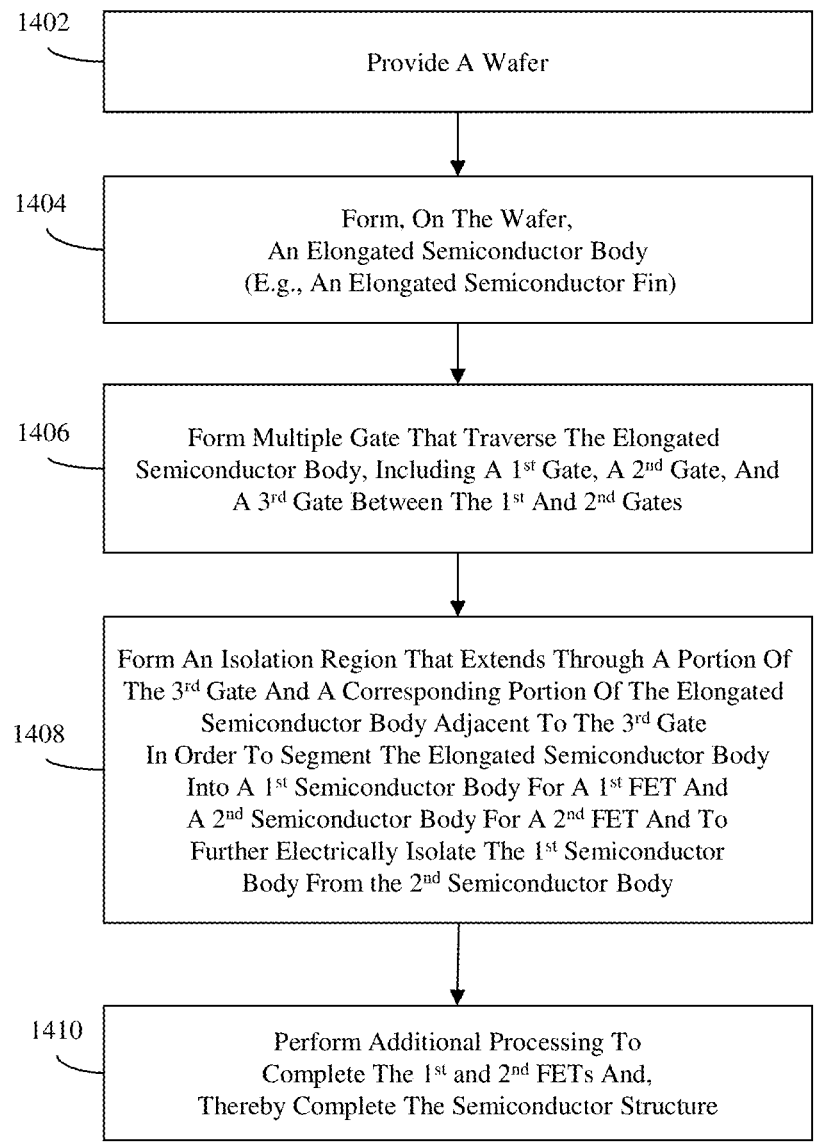
FIG. 14 is a flow diagram illustrating another method of forming a semiconductor structure comprising multiple field effect transistors.
Figure 15A:
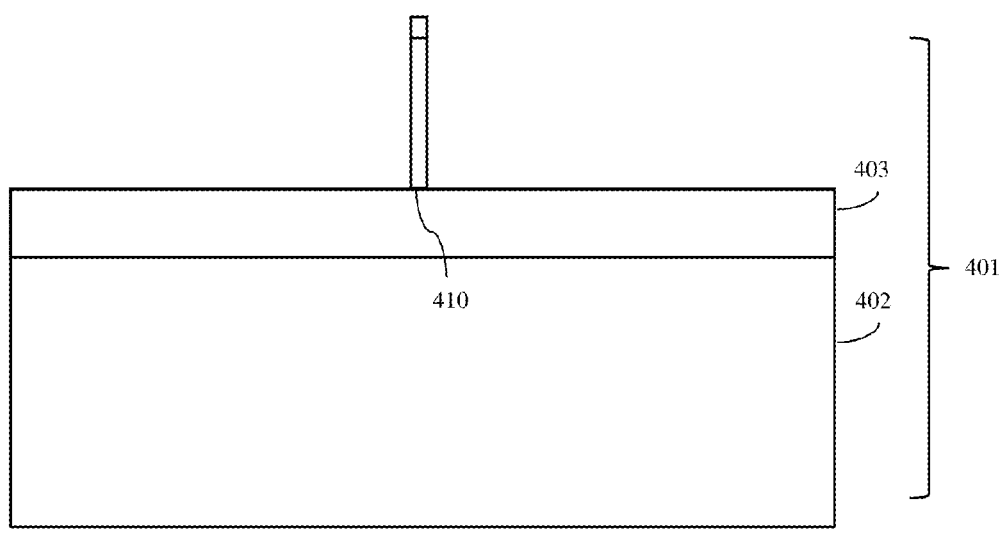
FIG. 15A is a cross-section view diagram illustrating a partially completed semiconductor structure formed according to the method of FIG. 14.
Figure 15B:
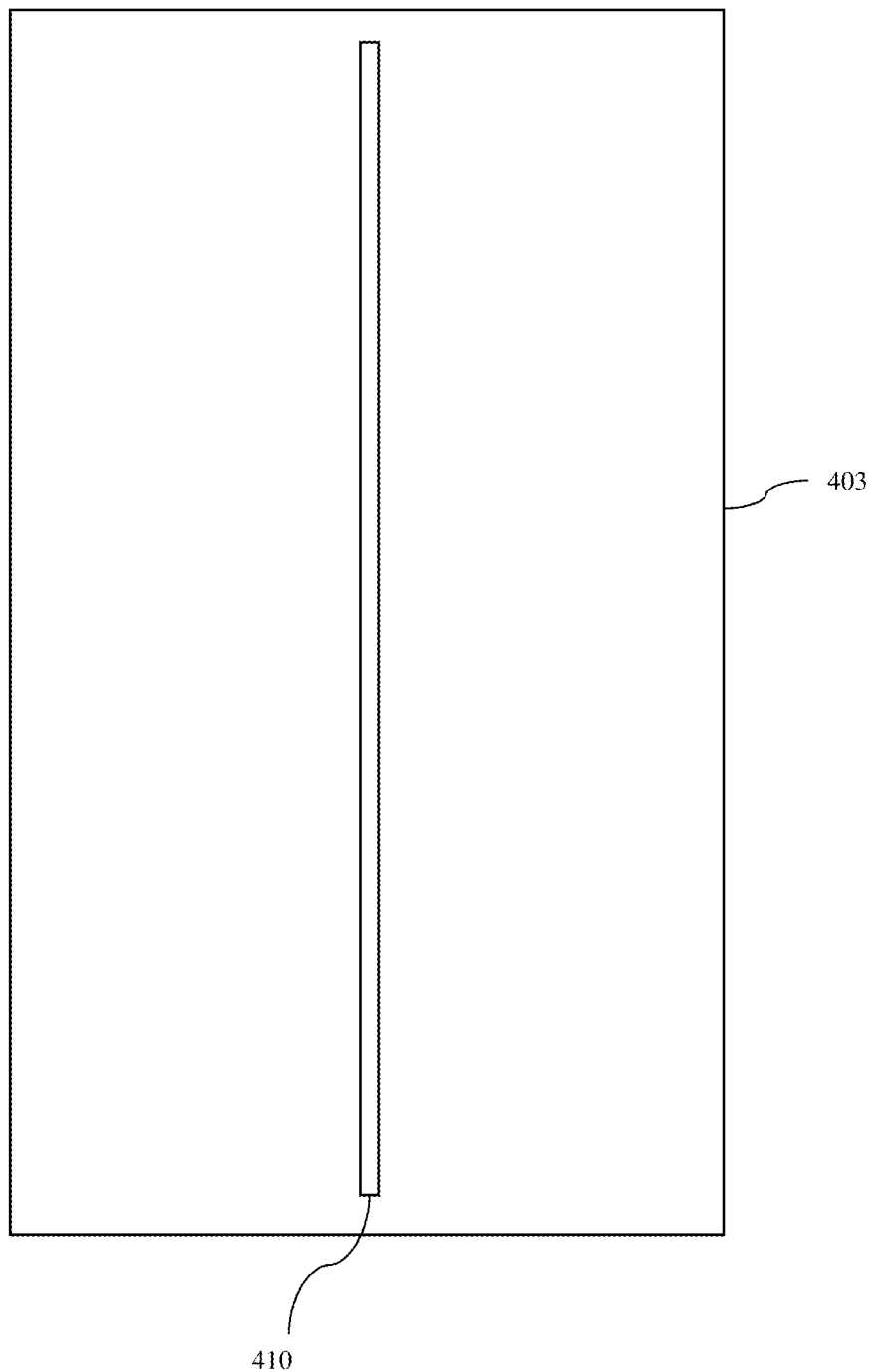
FIG. 15B is a top view diagram illustrating the same partially completed semiconductor structure shown in FIG. 15A.

Referring to FIG. 14, also disclosed herein is a second method of forming a semiconductor structure comprising multiple field effect transistors (FETs), wherein a gate cut process is used following final gate formation in order to allow for an increase in device density. Specifically, this second method can comprise providing a wafer 401 and forming, on that wafer 401, an elongated semiconductor body 410 to be used in forming multiple FETs and, particularly, a first FET and a second FET (1402-1404, see FIGS. 15A-15B).

The wafer 401 can comprise, for example, a semiconductor-on-insulator (SOI) wafer. This SOI wafer can comprise a semiconductor substrate 402 (e.g., a silicon substrate or any other suitable bulk semiconductor substrate, such as a germanium substrate, a gallium arsenide substrate, a gallium nitride substrate, etc.), an insulator layer 403 (e.g., a silicon dioxide layer, a silicon nitride layer, a silicon oxynitride layer or any other suitable insulator layer) on the semiconductor substrate 402 and a semiconductor layer on the insulator layer 403. In this case, the elongated semiconductor body 410 can be formed in the semiconductor layer such that it is electrically isolated from the semiconductor substrate 402 by the insulator layer 403.

Alternatively, the wafer 401 can comprise a bulk semiconductor substrate such as a bulk silicon substrate or any other suitable bulk semiconductor substrate (e.g., a bulk germanium substrate, a bulk gallium arsenide substrate, a bulk gallium nitride substrate, etc.). In this case, the elongated semiconductor body 410 can be formed in an upper portion of the bulk semiconductor substrate and, optionally, either before or after the elongated semiconductor 410 is formed, at least one insulator region (e.g., one or more well regions, one or more trench isolation regions, etc.) can be formed within the bulk semiconductor substrate using conventional processing techniques so as to electrically isolate the elongated semiconductor body 410 from a lower portion of the bulk semiconductor substrate.

For purposes of illustration, additional process steps of this second method will be described and illustrated in the Figures with respect to a partially completed semiconductor structure formed on an SOI wafer. However, it should be understood that the description and Figures are not intended to be limiting and that similar process steps can be employed when forming a semiconductor structure on a bulk semiconductor wafer.

Those skilled in the art will recognize that the shape of the elongated semiconductor body 410 and the technique used to form that elongated semiconductor body 410 will vary depending upon whether the multiple FETs being formed are to be planar FETs or multi-gate non-planar FETs (MUGFETs). For example, for planar FETs, a planar semiconductor body can be defined in the semiconductor layer (or upper portion of the bulk semiconductor substrate, if applicable) by forming a shallow trench isolation (STI) region (e.g., using conventional STI processing techniques). For multi-gate non-planar FETs (MUGFETs), such as fin-type FETs (finFETs) (also referred to herein as dual gate FETs) or tri-gate FETs, a non-planar semiconductor body (e.g., a fin-shaped semiconductor body, also referred to herein as a semiconductor fin) can be defined in the semiconductor layer (or upper portion of the bulk semiconductor substrate, if applicable) using conventional lithographic patterning and etch techniques or sidewall image transfer (SIT) techniques. Those skilled in the art will recognize that the dimensions of the non-planar semiconductor body and whether or not it remains capped with a dielectric will vary depending upon whether the MUGFETs being formed are finFETs or tri-gate FETs. Techniques for forming both planar and non-planar semiconductor bodies are well known in the art and, thus, the details are omitted from this specification in order to allow the reader to focus on the salient aspects of the disclosed method.

For purposes of illustration, additional process steps of this second method will be described and illustrated in the Figures with respect to a partially completed semiconductor structure comprising a non-planar elongated semiconductor body (i.e., an elongated fin-shaped semiconductor body or an elongated semiconductor fin), which is relatively thin and capped with a dielectric, for use in forming finFETs. However, it should be understood that the description and Figures are not intended to be limiting and that similar process steps can be employed following formation of a planar semiconductor body for use in forming planar FETs or following formation of a non-planar semiconductor body, which is relatively thick and uncapped, for use in forming tri-gate FETs.

The elongated semiconductor body 410 formed at process 1404 is referred to as "elongated" because it is larger and, particularly, significantly longer than what is necessary for either the first or second FETs such that it can subsequently be segmented, as described in greater detail below, during a gate cut process in order to form first and second semiconductor bodies, respectively, for the first and second FETs.

After the elongated semiconductor body 410 is formed at process 1404, multiple gates 430(a)-(c) can be formed across that elongated semiconductor body 410 (1406, see FIGS. 16-18B). These multiple gates 430(a)-(c) can comprise at least a first gate 430(a) for a first FET, a second gate 430(b) for a second FET and a third gate 430(c) between the first gate 430(a) and the second gate 430(b). These multiple gates 430(a)-(c) can each be laterally surrounded by a corresponding gate sidewall spacer 420.

The gates 430(a)-(c) formed at process 1406 will remain present in the resulting semiconductor structure and the gates 430(a)-(b) will be the final gate structures for the first and second FETs.

The gates 430(a)-(c) formed at process 1506 can comprise replacement gates (e.g., replacement metal gates). Those skilled in the art will recognize that a "replacement gate" refers to a gate, which replaces a previously formed dummy gate. These gates can be formed in a similar manner as the elongated gated 230 discussed in the first method described above.

Figure 16:
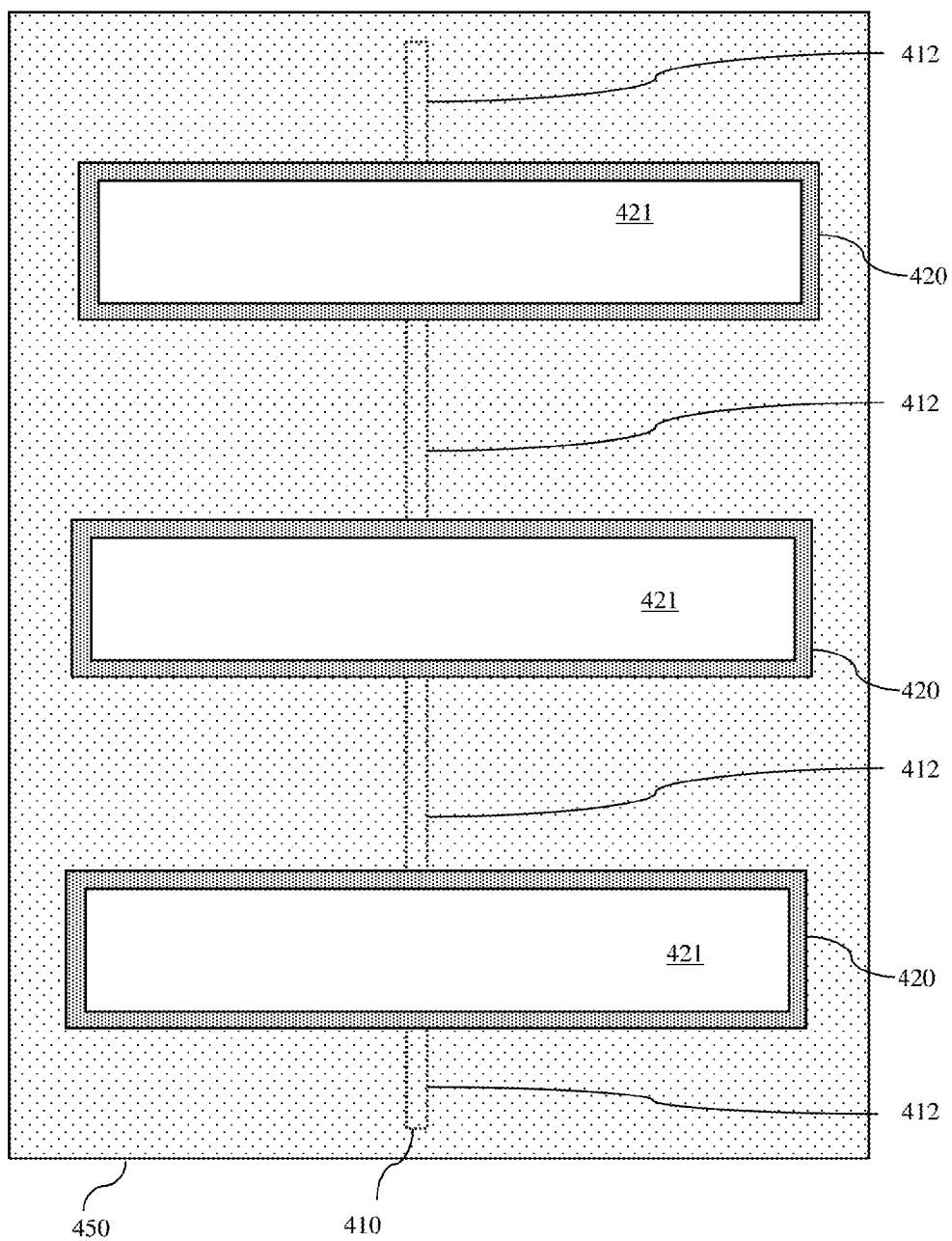
FIG. 16 is a top view diagram illustrating a partially completed semiconductor structure formed according to the method of FIG. 14.

That is, to form such replacement gates, following formation of the elongated semiconductor body 410 and before the gates 430(a)-(c) are formed, dummy gates 421(a)-(c) can be formed that traverse channel regions, which are positioned laterally between source/drain regions 412, in the elongated semiconductor body 410 (see FIG. 16). To form such dummy gates 421, a blanket dummy gate material layer (e.g., a silicon layer, a polysilicon layer, or an amorphous silicon layer) can be deposited over the elongated semiconductor body 410. This dummy gate material layer can then be lithographically patterned and etched so as to expose the source/drain regions 412 within the elongated semiconductor body 410 and cover the channel regions positioned laterally between those source/drain regions 412. Following formation of the dummy gates 421, gate sidewall spacers 420 can be formed adjacent to the vertical sidewalls of each of the dummy gates 421 such that each dummy gate 421 is laterally surrounded by a corresponding gate sidewall spacer 420 (see FIG. 16). The gate sidewall spacers 420 can comprise, for example, one or more dielectric layers comprising any of silicon dioxide, silicon nitride, silicon oxynitride, air-gaps, etc. and can be formed using conventional sidewall spacer formation techniques. For example, a dielectric layer can be deposited over the dummy gates 421 and an anisotropic etch process can be performed in order to remove the dielectric layer from horizontal surfaces such that the resulting gate sidewall spacers 420 remain only on the vertical sidewalls of the dummy gates 421.

After the dummy gates 421 and gate sidewall spacers 420 are formed, at least one dopant implantation process can be performed so as to at least dope the source/drain regions 412 in the exposed portions of the elongated semiconductor body 410. It should be understood that additional dopant implantation processes can be performed before and/or after the formation of the dummy gates and gate sidewall spacers in order to dope additional regions in the semiconductor body for the first FETs and/or second FETs (e.g., source/drain extension regions, halo regions, etc.).

It should also be understood that the first and second FETs being formed according to this method can be the same type FETs (e.g., all N-type FETs or all P-type FETs) or different type FETs (e.g., N-type and P-type FETs, respectively). Those skilled in the art will recognize that different types of dopants can be used to dope the source/drain regions in order to form N-type FETs or P-type FETs. For example, the source/drain regions of N-type FETs can be doped with an N-type dopant, whereas the source/drain regions of P-type FETs can be doped with a P-type dopant. The N-type or P-type dopants will vary depending upon the different semiconductor materials used. For example, a silicon-based semiconductor material can be doped with arsenic (As), phosphorous (P) or antimony (Sb) so as to have N-type conductivity or can be doped with boron (B), boron difluoride ($BF_2$) or indium (In) so as to have P-type conductivity. In another example, a gallium arsenide (GaAs) or gallium nitride (GaN)-based semiconductor material can be doped with silicon (Si) so as to have N-type conductivity or can be doped with magnesium (Mg) or beryllium (Be) so as to have P-type conductivity. Those skilled in the art will also recognize that the higher the concentration of the particular dopant used, the higher the conductivity level associated with that dopant and vice versa. Furthermore, the different conductivity types and levels will depend upon the relative concentration levels of different type dopants in the same region. In any case, if the first and second FETs being formed are to be different type FETs, multiple masked dopant implantation processes can be used to dope the source/drain regions, as necessary.

Subsequently, a blanket dielectric layer 450 (e.g., a silicon dioxide layer, a silicon nitride layer, a silicon oxynitride layer or any other suitable dielectric layer) can be formed over the dummy gates 421, the gate sidewall spacers 420 and the exposed portions of the semiconductor body 410 (i.e., over the source/drain regions 412) and this dielectric layer 450 can be planarized (e.g., using a conventional chemical mechanical polishing (CMP) process) so as to expose the top surfaces of the dummy gates 421 (see FIG. 16).

Figure 17:
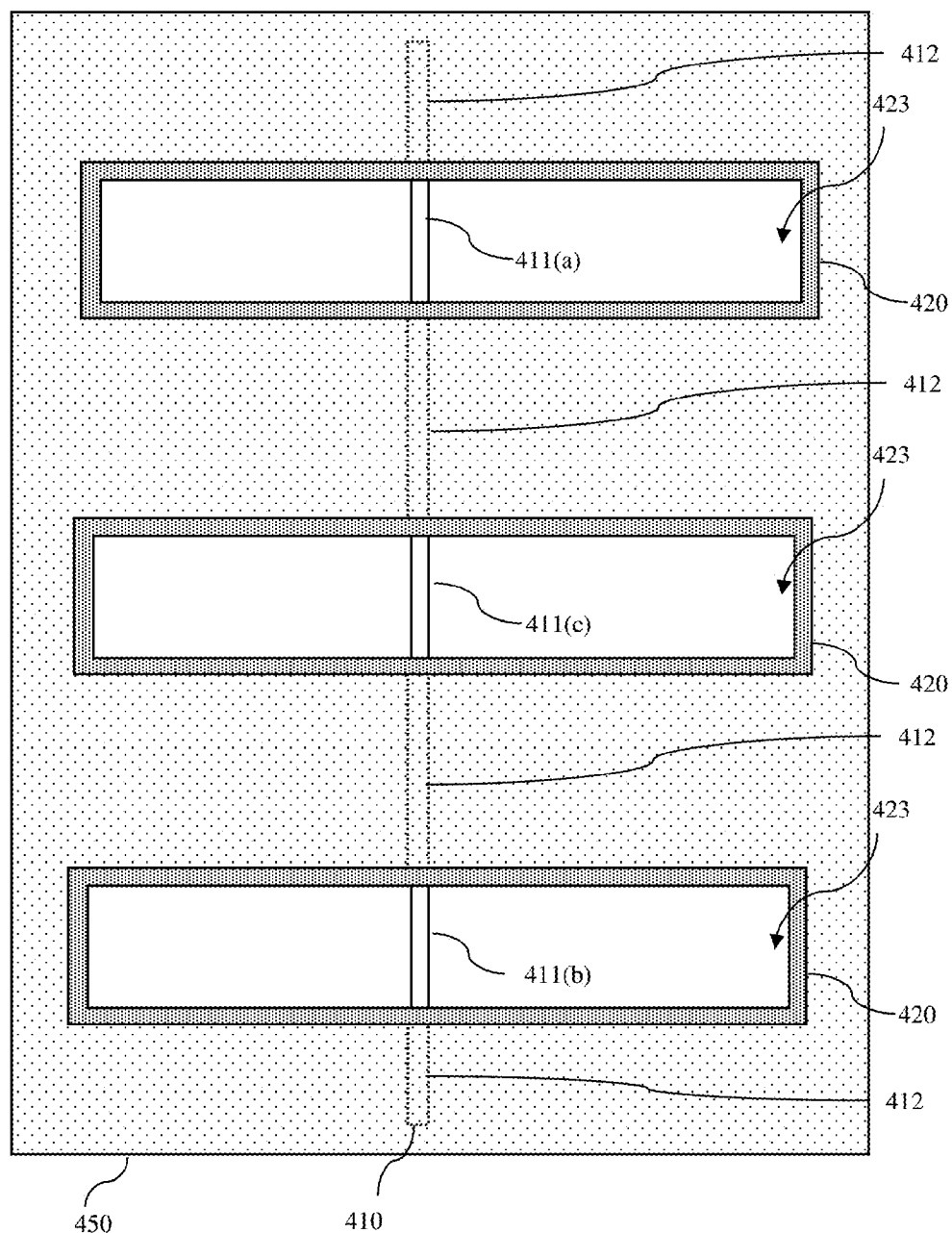
FIG. 17 is a top view diagram illustrating a partially completed semiconductor structure formed according to the method of FIG. 14.

Once the dummy gates 421 are exposed, they can be selectively removed using, for example, an etch process that is selective for the dummy gate material over the materials used for the dielectric layer 450 and gate sidewall spacers 420 (see FIG. 17). Removal of the dummy gates 421 creates trenches 423 and exposes the multiple channel regions 411(a)-(c) of the elongated semiconductor body 410 within those trenches 423. It should be understood that, when the elongated semiconductor body 410 is a non-planar semiconductor body (e.g., a fin-shaped semiconductor body or semiconductor fin), as shown, the tops and opposing sidewalls of that elongated semiconductor body 410 at each of the corresponding channel regions 411(a)-(c) will be exposed.

Once the dummy gates 421 are removed, they can each be replaced with a replacement gate, thereby forming the multiple gates 430(a)-(c) that are laterally surrounded by gate sidewall spacers 420.

More specifically, the dummy gates 421 can be replaced with replacement metal gates (see FIGS. 18A-18B) by forming a conformal high-K gate dielectric layer 431 on exposed vertical and horizontal surfaces within the trenches 423. That is, a conformal high-K gate dielectric layer 431 can be formed within each trench 423 immediately adjacent to the gate sidewall spacer 420 and immediately adjacent to the channel region (e.g., in the case of a non-planar semiconductor body, as shown, on the opposing sidewalls and over the top of the elongated semiconductor body 410 at the channel region exposed within the trench 423). This high-K gate dielectric layer 431 can comprise, for example, a hafnium (Hf)-based dielectric layer (e.g., hafnium oxide, hafnium silicon oxide, hafnium silicon oxynitride, hafnium aluminum oxide, etc.) or some other suitable high-K dielectric layer (e.g., aluminum oxide, tantalum oxide, zirconium oxide, etc.). Next, a gate conductor layer 435, including one or more gate conductor materials, can be formed on the conformal high-K gate dielectric layer 431 within each trench 423. For example, a conformal first metal 432 can be formed over the conformal high-K gate dielectric layer 431 and a second metal 433 can be deposited onto the conformal first metal 432 so as to fill the remaining space within each trench 423. The first metal 432 can comprise a metal selected so as to have a specific work function appropriate for a given type FET (e.g., an N-type FET or a P-type FET). For example, for a silicon-based N-type FET, the first metal 432 can comprise, for example, hafnium, zirconium, titanium, tantalum, aluminum, or alloys thereof, such as, hafnium carbide, zirconium carbide, titanium carbide, tantalum carbide, or aluminum carbide so that the first metal 432 has a work function similar to that of N-doped polysilicon. For a silicon-based P-type FET, the first metal 432 can comprise, for example, ruthenium, palladium, platinum, cobalt, or nickel, or a metal oxide (e.g., aluminum carbon oxide or aluminum titanium carbon oxide) or a metal nitride (e.g., titanium nitride, titanium silicon nitride, tantalum silicon nitride, titanium aluminum nitride, or tantalum aluminum nitride) so that the first metal 432 has a work function similar to that of P-doped polysilicon. The second metal 433 can comprise, for example, a metal fill material (e.g., tungsten). In any case, forming the multiple gates 430(a)-(c) as replacement metal gates in this manner results in the conformal high-K gate dielectric layer 431 within each trench 423 being positioned between the gate conductor layer 435 and the elongated semiconductor body 410 and also between the gate conductor layer 435 and the gate sidewall spacer 420.

Alternatively, the multiple gates formed at process 1406 can comprise conventional gates, which are formed prior to dopant implantation process(es) used to dope the source/drain regions, etc. within the elongated semiconductor body 410 and which are formed without the use of dummy gates. For example, a gate dielectric layer can be formed by depositing at least one dielectric material (e.g., silicon dioxide, silicon nitride, silicon oxynitride or any other suitable dielectric material) over the elongated semiconductor body 410. Then, a gate conductor layer can be formed by depositing at least one gate conductor material (e.g., doped polysilicon or any other suitable gate conductor material) onto the gate dielectric layer. The resulting gate stack can be lithographically patterned and etched into multiple conventional gates, exposing the source/drain regions within the elongated semiconductor body and covering the channel regions positioned laterally between those source/drain regions. Next, gate sidewall spacers can be formed adjacent to the vertical sidewalls of the conventional gates so that each conventional gate is laterally surrounded by a corresponding gate sidewall spacer. As discussed above, such gate sidewall spacers can comprise, for example, one or more dielectric layers comprising any of silicon dioxide, silicon nitride, silicon oxynitride, air-gaps, etc. and can be formed using conventional sidewall spacer formation techniques. After the conventional gates and corresponding gate sidewall spacers are formed, at least one dopant implantation process can be performed so as to at least dope the source/drain regions in the exposed portions of the elongated semiconductor body.

For purposes of illustration, additional process steps of this second method will be described and illustrated in the Figures with respect to a partially completed semiconductor structure comprising multiple gates comprising replacement metal gates. However, it should be understood that the description and Figures are not intended to be limiting and that similar process steps can be employed during formation of a semiconductor structure comprising multiple gates comprising conventional gates.

Figure 19A:
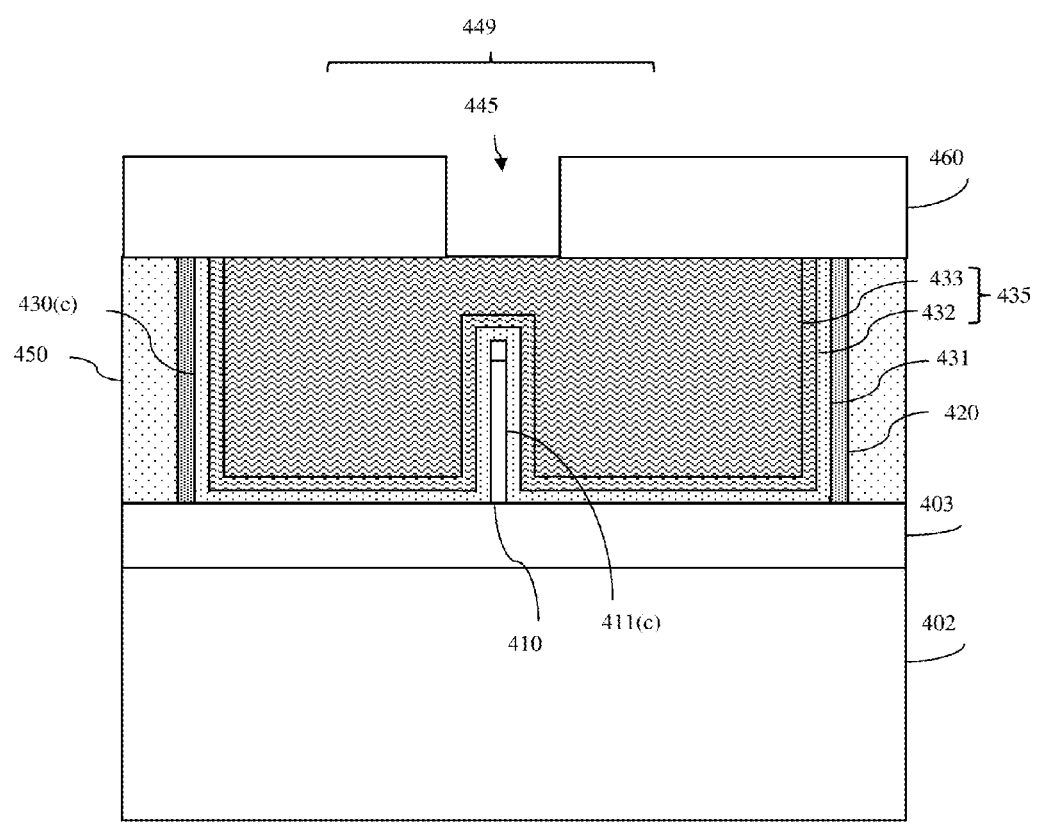
FIG. 19A is a cross-section view diagram illustrating a partially completed semiconductor structure formed according to the method of FIG. 14.
Figure 19B:
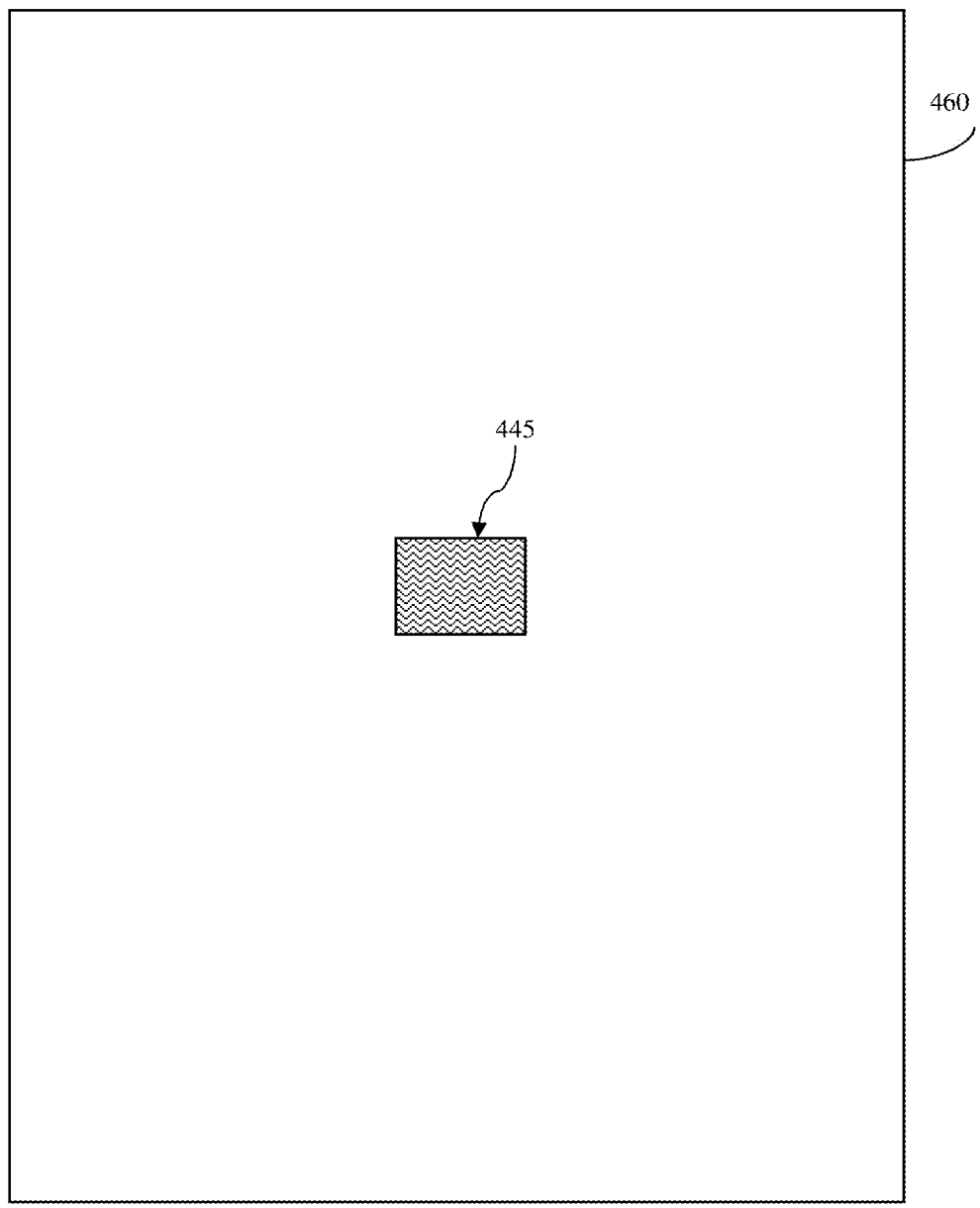
FIG. 19B is a top view diagram illustrating the same partially completed semiconductor structure shown in FIG. 19A.

After the multiple gates 430(a)-(c) are formed at process 1406, an isolation region 440 can be formed that extends through a portion of the third gate 430(c) (i.e., the center one of the three gates 430(a)-(c)) and further through a corresponding portion of the elongated semiconductor body 410 (i.e., the channel region 411(c)) adjacent to that the third gate 430(c) in order to segment the elongated semiconductor body 410 into a first semiconductor body 410.1 for a first FET and a second semiconductor body 410.2 for a second FET and to further electrically isolate the first semiconductor body 410.1 from the second semiconductor body 410.2 (1408 see FIGS. 19A-19B and either FIGS. 20-21 or FIGS. 22A-24B).

Figure 18A:
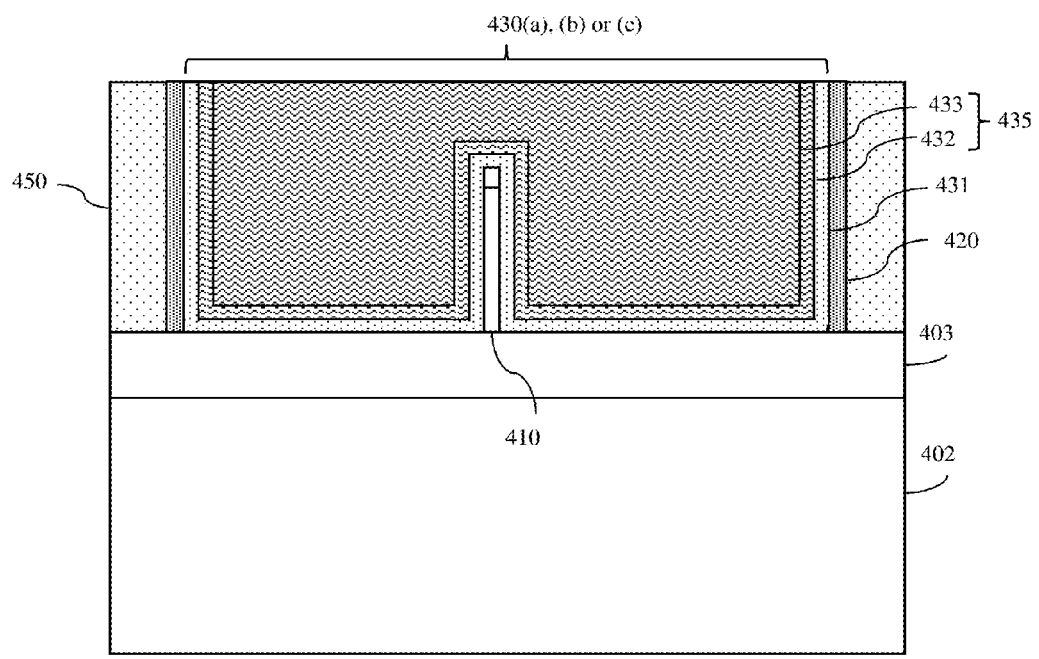
FIG. 18A is a cross-section view diagram illustrating a partially completed semiconductor structure formed according to the method of FIG. 14.
Figure 18B:
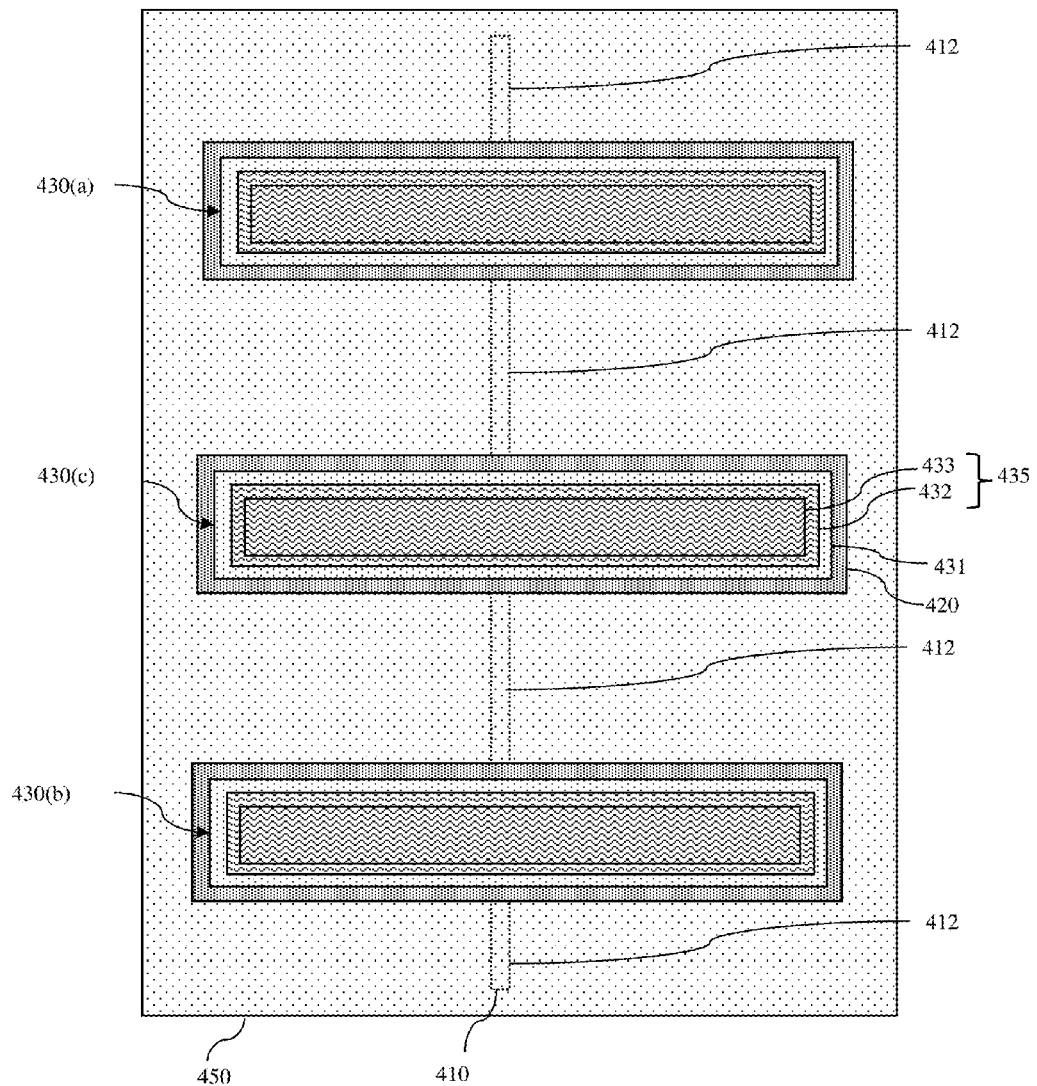
FIG. 18B is a top view diagram illustrating the same partially completed semiconductor structure shown in FIG. 18A.

To form such an isolation region 440 at process 1408, a mask layer 460 can be deposited over the partially completed structure shown in FIGS. 18A-18B and this mask layer 460 can be lithographically patterned with an opening 445 that is aligned above the portion 449 of the third gate 430(c) that is immediately adjacent to the channel region 411(c) within the elongated semiconductor body 410 (see FIGS. 19A-19B).

Figure 20:
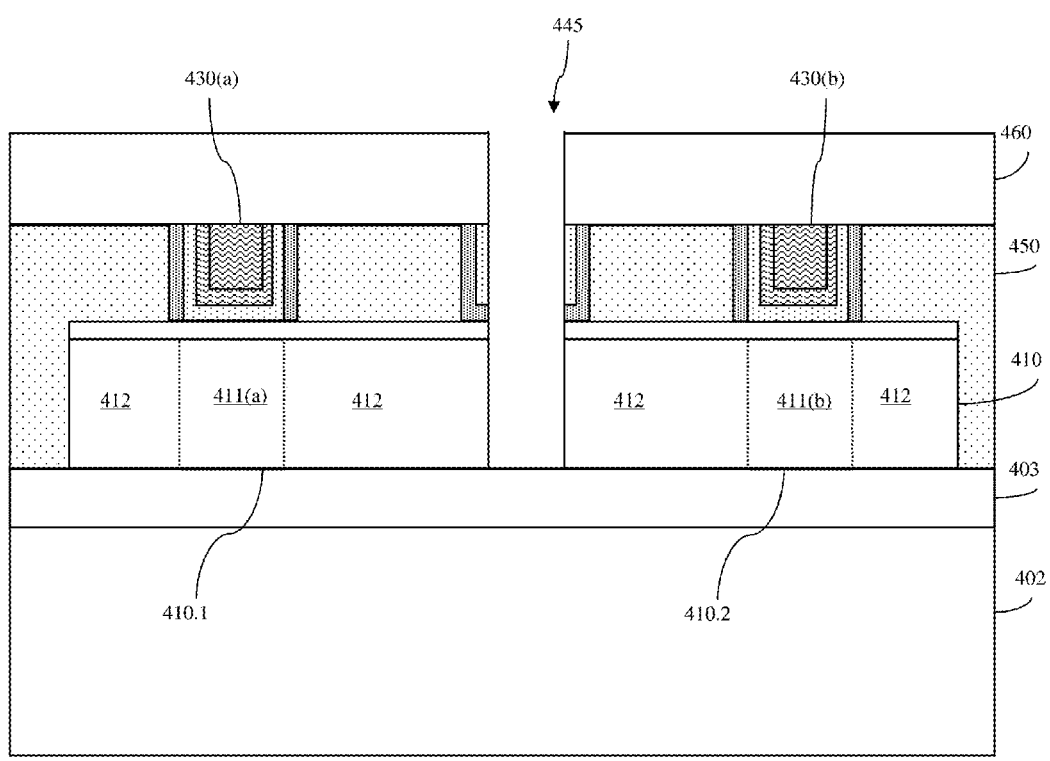
FIG. 20 is a cross-section view diagram illustrating a partially completed semiconductor structure formed according to the method of FIG. 14.

The opening 445 can further be etched such that it extends through the portion 449 of the third gate 430(c) and further entirely through the corresponding portion of the elongated semiconductor body 410 adjacent to that third gate 430(c) (i.e., entirely through the channel region 411(c), stopping below the elongated semiconductor body 410 (e.g., on the insulator layer 403, as shown) in order to physically segment the elongated semiconductor body 410 into two discrete semiconductor bodies (i.e., a first semiconductor body 410.1 for the first FET and a second semiconductor body 410.2 for the second FET) (see FIG. 20). Then, at least one isolation layer 441 can be deposited, filling the opening 445 such that the isolation layer 441 is positioned laterally between and immediately adjacent to the first semiconductor body 410.1 and the second semiconductor body 410.2 (see FIG. 21).

Figure 22A:
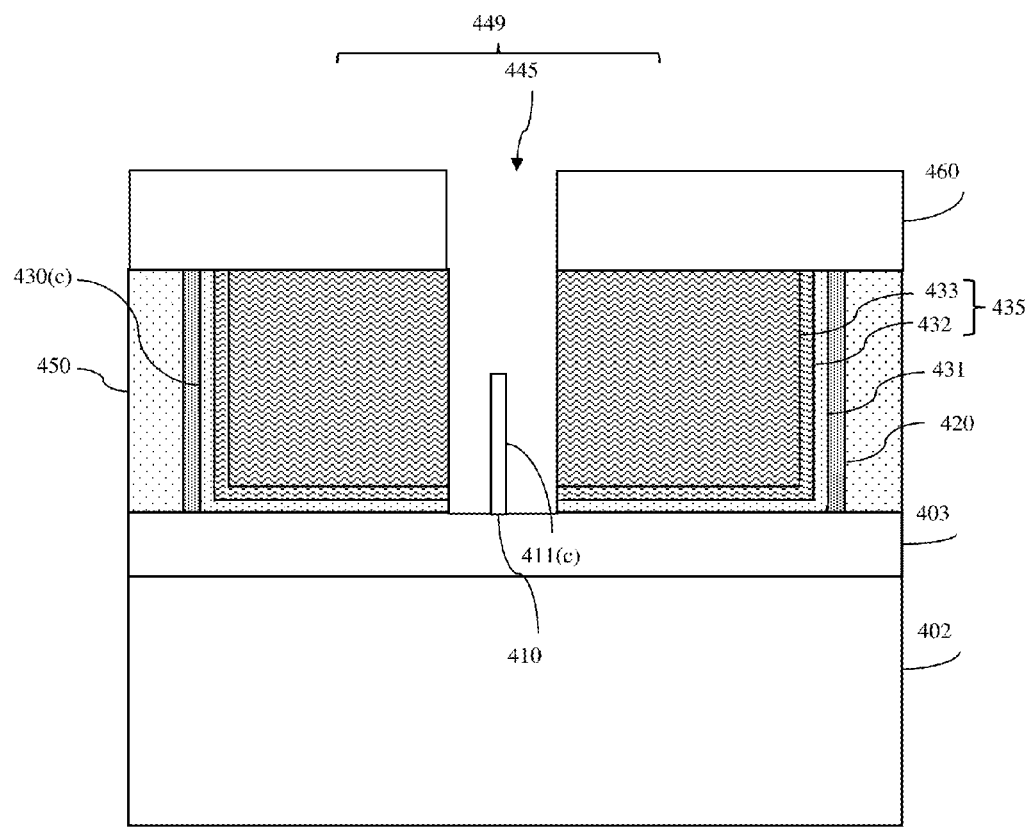
FIG. 22A is a cross-section view diagram illustrating an alternative partially completed semiconductor structure formed according to the method of FIG. 14.
Figure 22B:
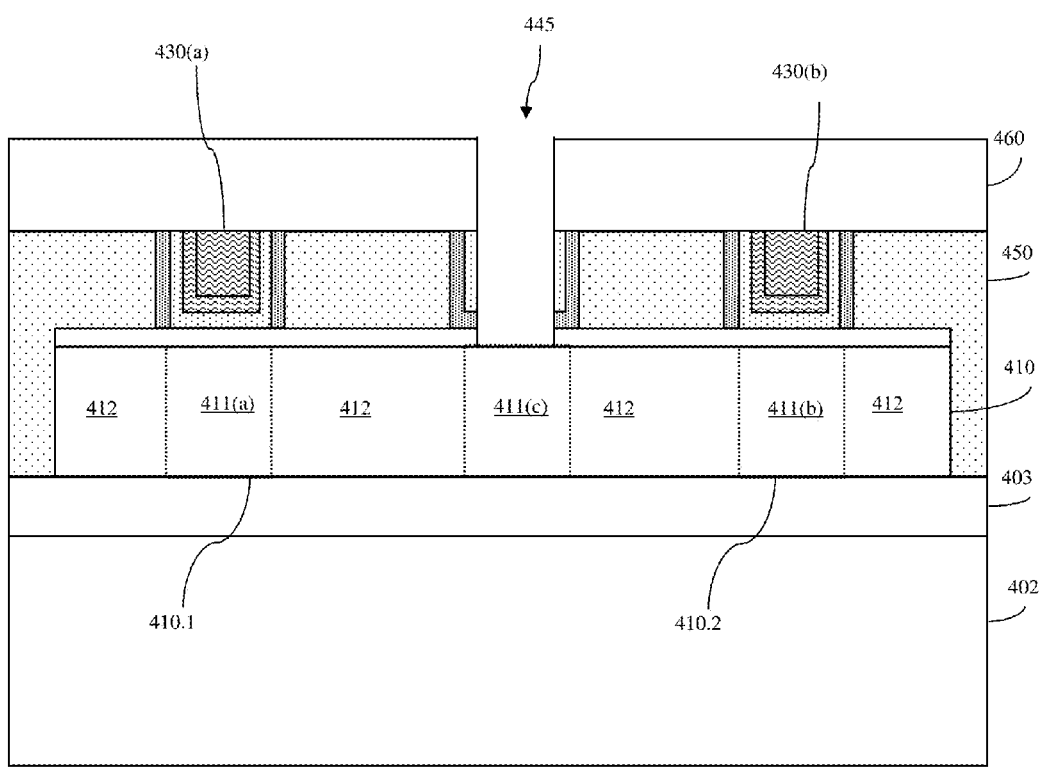
FIG. 22B is a different cross-section view diagram illustrating the same alternative partially completed semiconductor structure shown in FIG. 22A.
Figure 23:
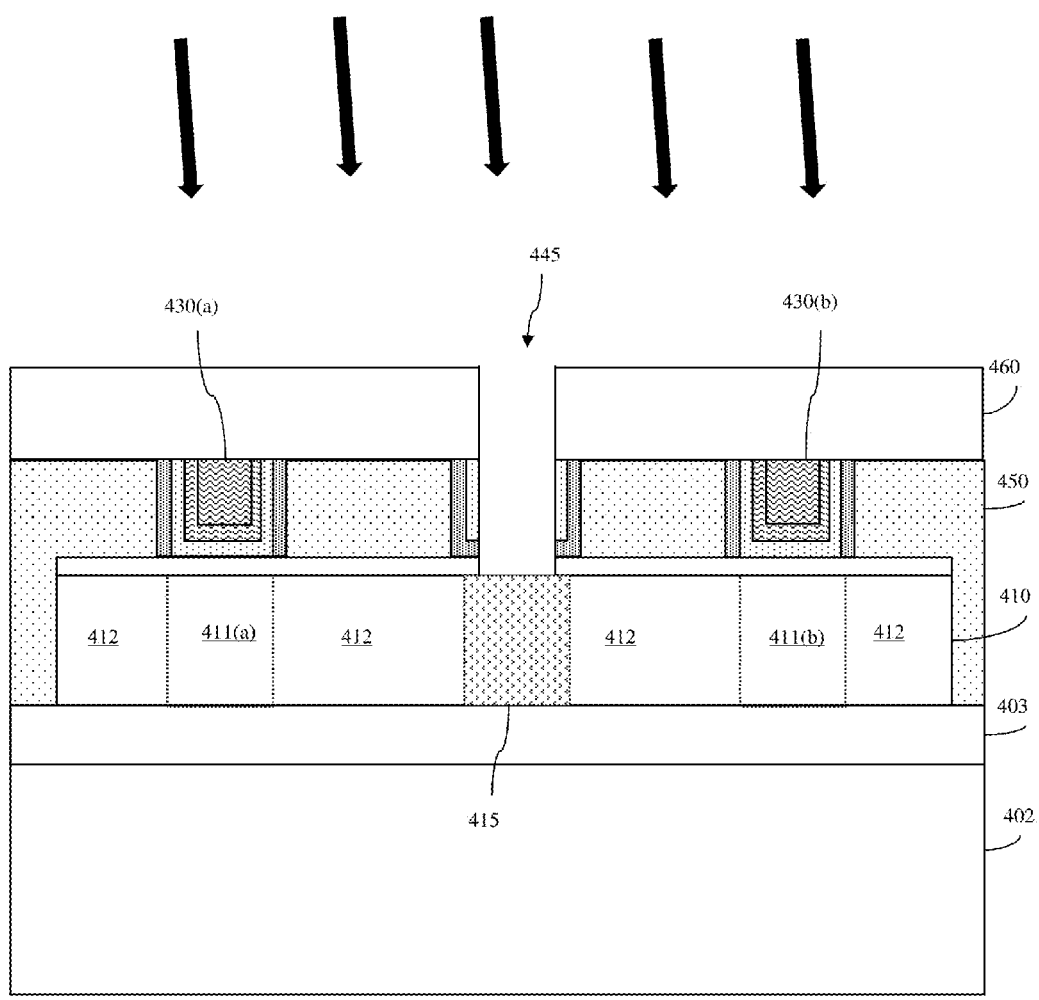
FIG. 23 is a cross-section view diagram illustrating an alternative partially completed semiconductor structure formed according to the method of FIG. 14.

Alternatively, the opening 245 can further be etched such that it extends through the portion 449 of the third gate 430(c) in order to expose the corresponding portion of the elongated semiconductor body 410 adjacent to the third gate 430(c) (i.e., to expose the channel region 411(c)) (see FIGS. 22A-22B). In the case of a non-planar semiconductor body, as shown, the opening will expose the opposing sides and top of the channel region 411(c). Next, a dopant implantation process can be performed in order to form a dopant implant region 415 in the corresponding portion of the elongated semiconductor body 410 exposed within the opening 445 (i.e., to form a dopant implant region 415 within the channel region 411(c)) (see FIG. 23). This dopant implant process should be performed such that the conductivity type and conductivity level of the dopant implant region 415 electrically isolate the source/drain regions 412 on either side of the dopant implant region 415 from each other. Thus, the dopant used during the dopant implantation process to form the dopant implant region 415 can have an opposite type conductivity than the adjacent source/drain regions 412 and a conductivity level that is at least equal to that of the adjacent source/drain regions 412. For example, if the adjacent source/drain regions 412 are doped with an N-type dopant at a relatively high conductivity level (i.e., if the adjacent source/drain regions 412 are N+ source/drain regions), then the dopant implant region 415 can be doped with a P-type dopant at a relatively high conductivity level (i.e., can be doped so as to be a P+ implant region) and vice versa. Next, at least one isolation layer 441 can be deposited, filling the opening 445 (see FIGS. 24A-24B). In this case, the isolation layer 441 within the opening 445 and the dopant implant region 415 within the elongated semiconductor body 410, in combination, form the isolation region 440 that electrically isolates the first semiconductor body 410.1 from the second semiconductor body 410.2.

In either case, formation of the opening 445 constitutes the gate cut process following final gate formation referred to above. Also in either case, the isolation layer 441 deposited into the opening 445 to complete the isolation region 440 can comprise, for example, a silicon dioxide layer, a silicon nitride layer, a silicon oxynitride layer or any other suitable isolation layer. This isolation layer 441 can comprise, for example, the same material or a different material that than used for the gate sidewall spacers 420 and/or the gate dielectric layer 431.

By cutting through the third gate 430(*c*) (i.e., a center one the three gates 430(*a*)-(*c*)) and segmenting the elongated semiconductor body 410 into electrically isolated first and second semiconductor bodies 410.1-410.2 in this manner, the spacing requirements necessary to avoid shorting between two semiconductor bodies in end-to-end alignment can be reduced and device density can be increased.

Figure 21:
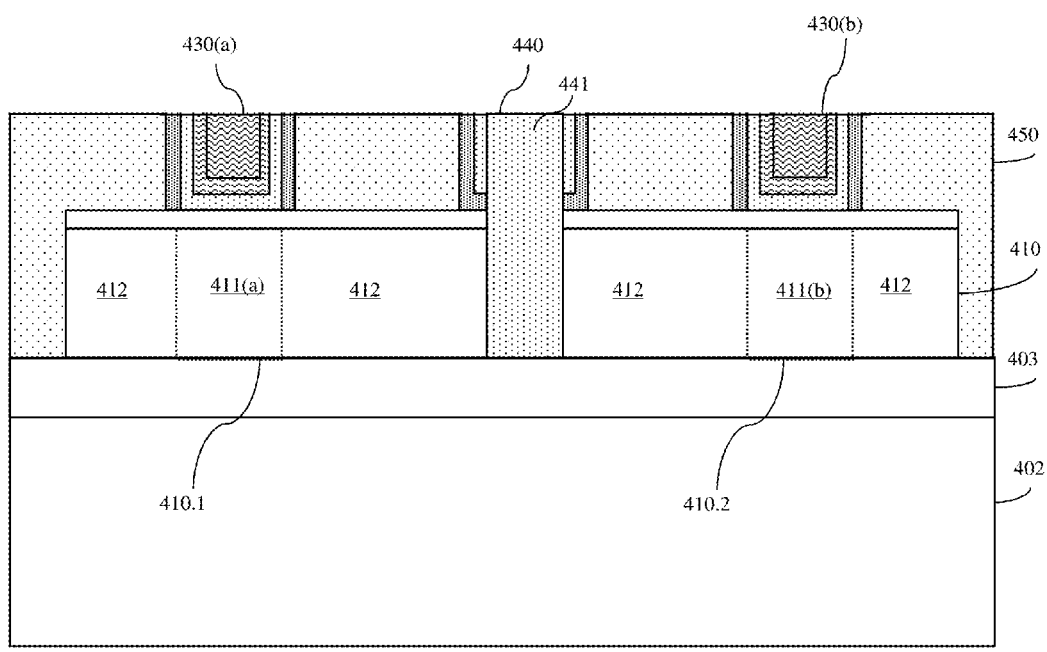
FIG. 21 is a cross-section view diagram illustrating a partially completed semiconductor structure formed according to the method of FIG. 14.
Figure 24A:
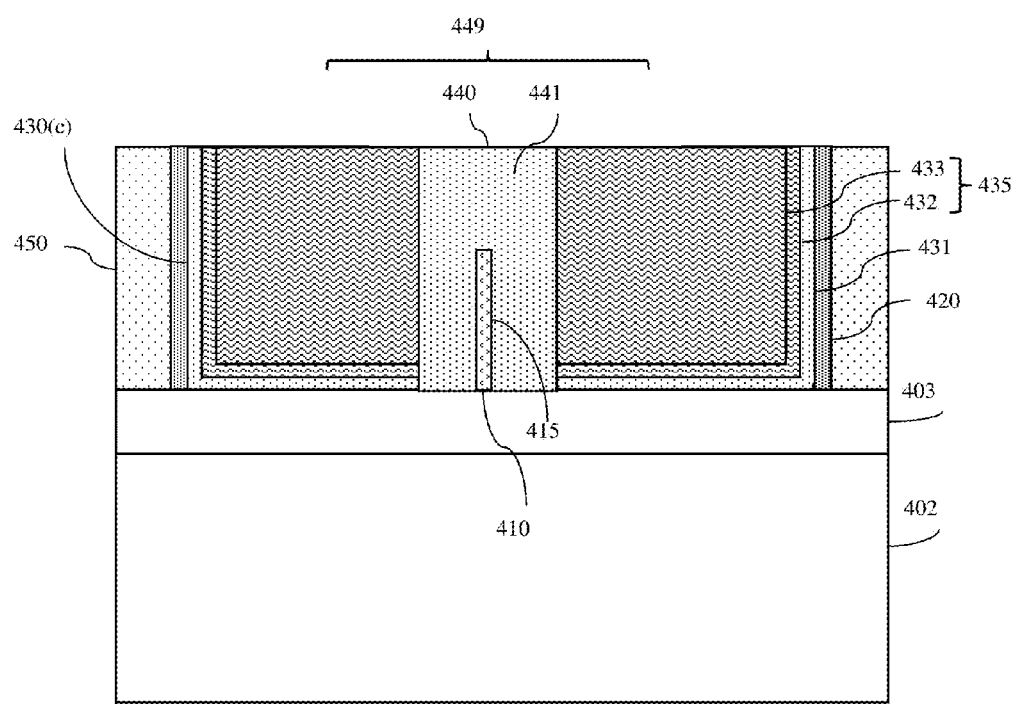
FIG. 24A is a cross-section view diagram illustrating an alternative partially completed semiconductor structure formed according to the method of FIG. 14.
Figure 24B:
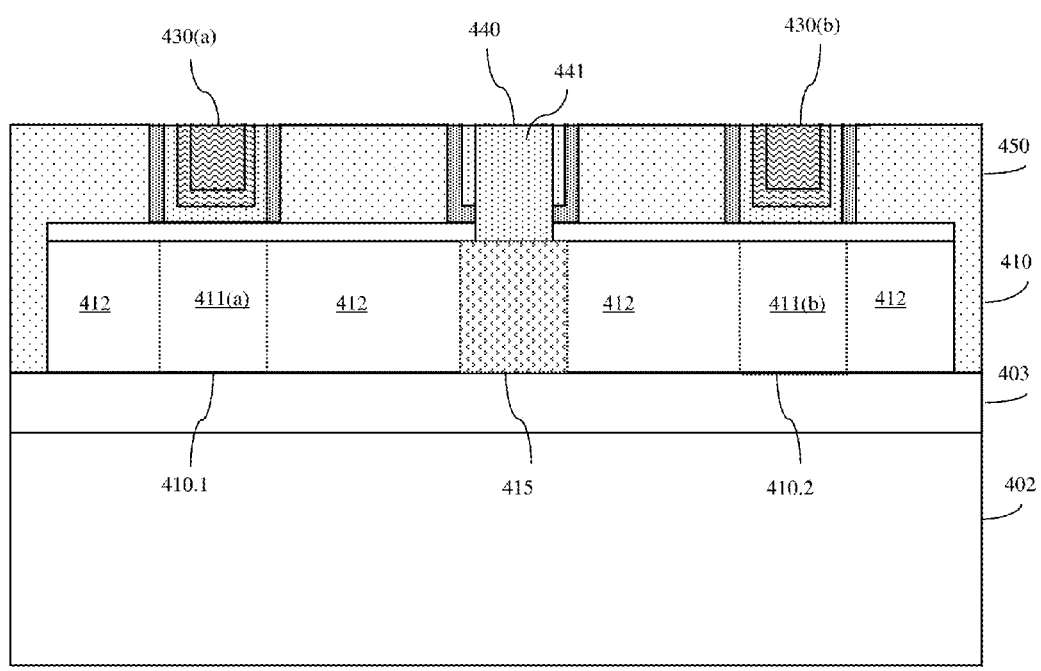
FIG. 24B is a different cross-section view diagram illustrating the same alternative partially completed semiconductor structure shown in FIG. 24A.
Figure 25:
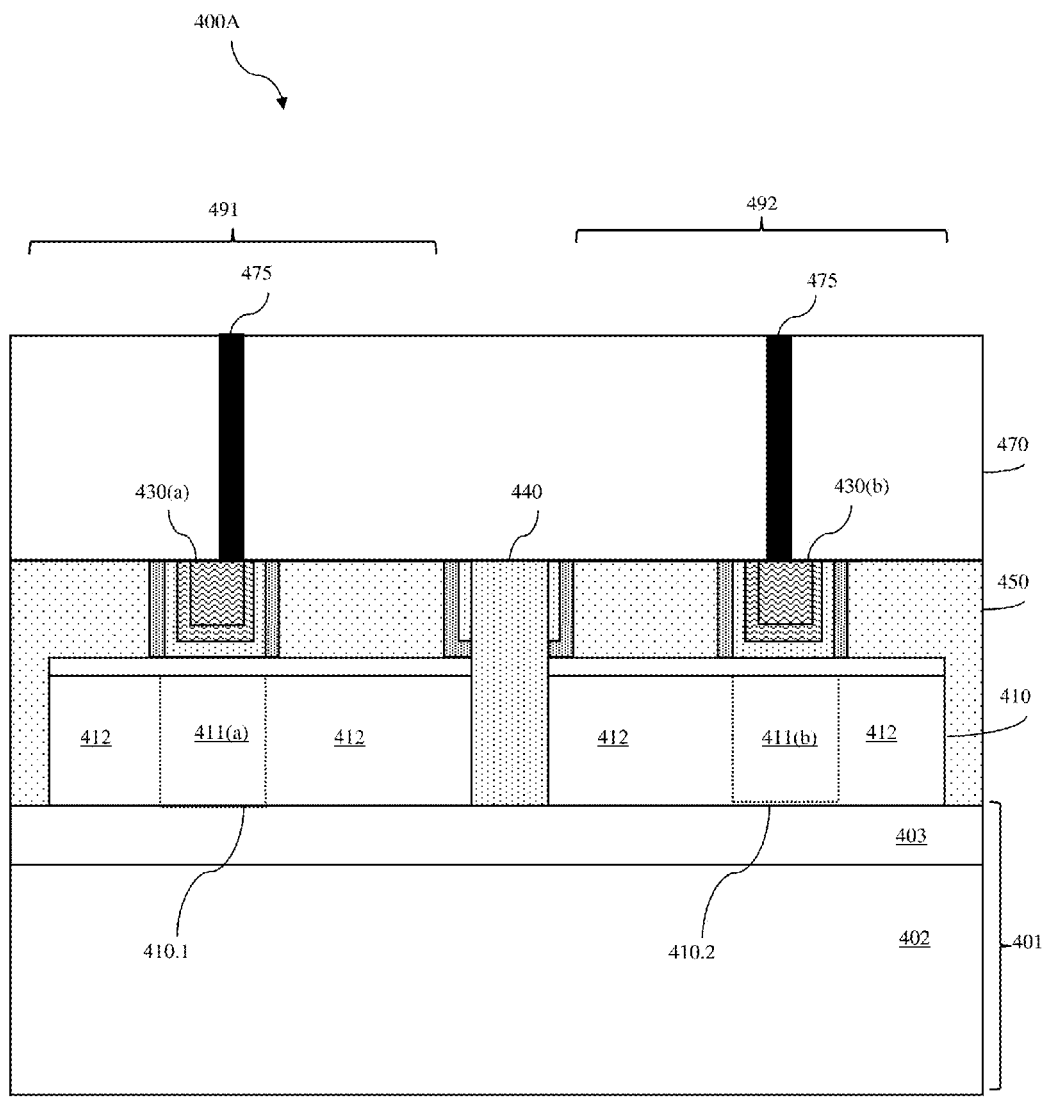
FIG. 25 is a cross-section view diagram illustrating a completed semiconductor structure formed according to the method of FIG. 14; and, FIG. 26 is a cross-section view diagram illustrating an alternative completed semiconductor structure formed according to the method of FIG. 14.
Figure 26:
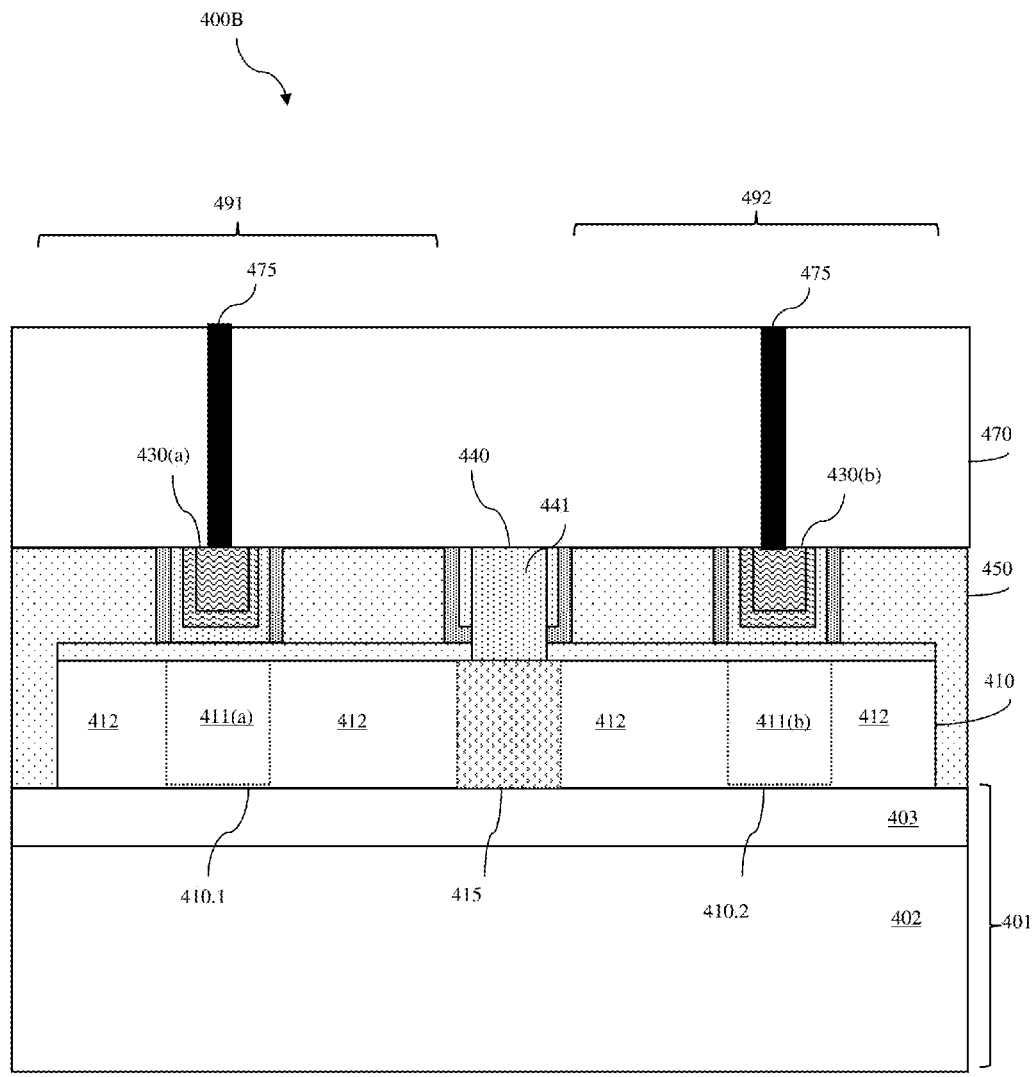

Following formation of the isolation region 440 at process 1408, additional processing can be performed on either of the partially completed semiconductor structures shown in FIG. 21 and FIGS. 24A-24B in order to complete either of the semiconductor structures 400A and 400B, respectively, each comprising a first FET 491 and a second FET 492 (1410, see FIG. 25 and FIG. 26). This additional processing can include, but is not limited to, deposition of one or more interlayer dielectrics 470 and formation of contacts 475 through the interlayer dielectric(s) 470 to the various components of the FETs 491-492 (e.g., to the first gate 430(*a*) and the second gate 430(*b*) of the first FET 491 and second FET 492, respectively). Techniques and materials used during interlayer dielectric deposition and contact formation are well known in the art and, thus, the details have been omitted from this specification in order to allow the reader to focus on the salient aspects of the disclosed method.

Thus, also disclosed herein are the semiconductor structure 400A, as shown in FIG. 25, and the semiconductor structure 400B, as shown in FIG. 26, each of which are formed according to the second method described above and illustrated in the flow diagram of FIG. 14. Each of these semiconductor structures 400A and 400B can comprise multiple field effect transistors (FETs) and, particularly, a first FET 491 and a second FET 492, each formed from the same elongated semiconductor body 410.

Specifically, the semiconductor structures 400A-400B can comprise semiconductor-on-insulator (SOI) structures formed on an SOI wafer. That is, the semiconductor structures 400A-400B can each comprise a semiconductor substrate 402, an insulator layer 403 on the semiconductor substrate 402 and an elongated semiconductor body 410 formed from a semiconductor layer above the insulator layer 403. Alternatively, the semiconductor structures 400A and 400B can comprise bulk semiconductor structures formed on a bulk semiconductor wafer. That is, the semiconductor structures 400A-400B can each comprise a bulk semiconductor substrate and an elongated semiconductor body formed from an upper portion of the bulk semiconductor substrate and electrically isolated from a lower portion of the semiconductor substrate (e.g., by one or more well regions, one or more trench isolation regions, etc.).

The elongated semiconductor body 410 is referred to herein as "elongated" because it is larger and, particularly, significantly longer than what is necessary for either the first or second FETs 491-492 such that it can be segmented, as described in greater detail above with regard to the method, during a gate cut process in order to form first and second semiconductor bodies 410.1-410.2, respectively, for the first and second FETs 491-492.

For purposes of illustration, the semiconductor structures 400A and 400B are illustrated in the Figures as SOI structures. However, it should be understood that the description and Figures are not intended to be limiting and that the additional features of the semiconductor structures 400A and 400B described below can also be present in similar bulk semiconductor structures.

Those skilled in the art will recognize that the shape of the elongated semiconductor body 410 will vary depending upon whether the first and second FETs 491-492 are planar FETs or multi-gate non-planar FETs (MUGFETs). For example, for planar FETs, the elongated semiconductor body 410 can comprise a planar semiconductor body defined by a shallow trench isolation (STI) region. However, for multi-gate non-planar FETs (MUGFETs), such as fin-type FETs (finFETs) (also referred to herein as dual gate FETs) or tri-gate FETs, the elongated semiconductor body 410 can comprise a non-planar semiconductor body (e.g., fin-shaped semiconductor body (also referred to herein as a semiconductor fin)). Those skilled in the art will also recognize that the dimensions of such a non-planar semiconductor body and whether or not it is capped with a dielectric will vary depending upon whether the MUGFETs are finFETs or tri-gate FETs. For finFETs, the non-planar semiconductor body will typically be relatively thin and capped with a dielectric cap. For tri-gate FETs, the non-planar semiconductor body will typically be relatively wide and uncapped.

For purposes of illustration, the semiconductor structures 400A and 400B are illustrated in the Figures as comprising finFETs formed from an elongated non-planar semiconductor body (e.g., an elongated semiconductor fin), which is relatively thin and capped with a dielectric. However, it should be understood that the description and Figures are not intended to be limiting and that the additional features of the semiconductor structures 400A and 400B described below can also be present in planar FETs formed from an elongated planar semiconductor body and tri-gate FETs formed from an elongated non-planar semiconductor body, which is relatively wide and uncapped.

In any case, the elongated semiconductor body 410 can comprise multiple channel regions 411(*a*)-411(*b*). These channel regions 411(*a*)-411(*b*) can each be positioned laterally between source/drain regions 412.

The semiconductor structures 400A and 400B can each further comprise multiple gates 430(*a*)-(*c*) that traverse the elongated semiconductor body 410 and that are each laterally surrounded by a corresponding gate sidewall spacer 420. Specifically, these multiple gates can comprise at least a first gate 430(*a*) for the first FET 491, a second gate 430(*b*) for the second FET and a third gate 430(*c*) between the first gate 430(*a*) and the second gate 430(*b*).

The gate sidewall spacers 420 can comprise, for example, one or more dielectric layers comprising any of silicon dioxide, silicon nitride, silicon oxynitride, air-gaps, etc.

The multiple gates 430(*a*)-(*c*) can each comprise a replacement gate (e.g., a replacement metal gate, as illustrated). For example, each gate 430(*a*)-(*c*) can comprise a conformal high-K gate dielectric layer 431. This high-K gate dielectric layer 431 can comprise, for example, a hafnium (Hf)-based dielectric layer (e.g., hafnium oxide, hafnium silicon oxide, hafnium silicon oxynitride, hafnium aluminum oxide, etc.) or some other suitable high-K dielectric layer (e.g., aluminum oxide, tantalum oxide, zirconium oxide, etc.). Each gate 430(*a*)-(*c*) can further comprise a gate conductor layer 435, including one or more gate conductor materials, on the conformal high-K gate dielectric layer 431. For example, the gate conductor layer 435 can comprise a conformal first metal 432 on the conformal high-K gate dielectric layer 431 and a second metal 433 on the conformal first metal 432. The first metal 432 can comprise a metal selected so as to have a specific work function appropriate for a given type FET (see detail discussion of the work function of metals above with regard to the method) and the second metal 433 can comprise, for example, a metal fill material (e.g., tungsten). Alternatively, any other suitable configuration of metal and/or metal alloys could be used for the gate conductor layer 435.

Alternatively, each gate 430(*a*)-(*c*) can comprise a conventional gate (not shown). Such a conventional gate can comprise a gate dielectric layer (e.g., a silicon dioxide layer or other suitable gate dielectric layer) and a gate conductor layer (e.g., a doped polysilicon layer or other suitable gate conductor layer) on the gate dielectric layer.

For purposes of illustration, the semiconductor structures 400A and 400B are illustrated in the Figures as comprising multiple gates 430(*a*)-(*c*) comprising replacement metal gates. However, it should be understood that the description and Figures are not intended to be limiting and that the additional features of the semiconductor structures 400A and 400B described below can also be present when the multiple gates 430(*a*)-(*c*) comprise conventional gates.

Each of the semiconductor structures 400A-400B can further comprise an isolation region 440 that extends through a portion of the third gate 430(*c*) (i.e., through a portion of a center one of the multiple gates 430(*a*)-(*c*)) and that further extends through a corresponding portion of the elongated semiconductor body 410 that is immediately adjacent to that third gate 430(*c*). This isolation region 440 can segment the elongated semiconductor body 410 into two semiconductor bodies and, particularly, a first semiconductor body 410.1 for the first FET 491 and a second semiconductor body 410.2 for the second FET 492, and can electrically isolate the first semiconductor body 410.1 from the second semiconductor body 410.2.

The isolation region 440 can, as shown in FIG. 25, comprise an opening that extends through a portion of the third gate 430(*c*) and further through a corresponding portion of the elongated semiconductor body 410 adjacent to that third gate 430(*c*) in order to physically segment the elongated semiconductor body 410 into two discrete semiconductor bodies (i.e., the first semiconductor body 410.1 and the second semiconductor body 410.2). Additionally, at least one isolation layer 441 can fill the opening such that the isolation layer 441 is positioned laterally between and immediately adjacent to the first semiconductor body 410.1 and the second semiconductor body 410.2.

Alternatively, the isolation region 440 can, as shown in FIG. 26, comprise an opening that extends through a portion of the third gate 430(*a*), exposing within that opening a corresponding portion of the elongated semiconductor body 410 adjacent to the third gate 430(*c*). In the case of a non-planar semiconductor body 410, the opposing sides and top of the corresponding portion of the elongated semiconductor body can be exposed within the opening. The isolation region 440 can further comprise a dopant implant region 415 in this corresponding portion of the elongated semiconductor body 410 adjacent to the third gate 430(*c*). The conductivity type and conductivity level of the dopant implant region 415 can be such that it electrically isolates the source/drain regions 412 on either side of the dopant implant region 415 from each other and, thereby effectively segments the elongated semiconductor body 410 into the first semiconductor body 410.1 and second semiconductor body 410.2. For example, the dopant used to form the dopant implant region 415 can have an opposite type conductivity than the adjacent source/drain regions 412 and a conductivity level that is at least equal to that of the adjacent source/drain regions 412. That is, if the adjacent source/drain regions 412 are doped with an N-type dopant at a relatively high conductivity level (i.e., if the adjacent source/drain regions 412 are N+ source/drain regions), then the dopant implant region 415 can be doped with a P-type dopant at a relatively high conductivity level (i.e., can be doped so as to be a P+ implant region) and vice versa. At least one isolation layer 441 can fill the opening. In this case, the isolation layer 441 within the opening and the dopant implant region 415 in the corresponding portion of the elongated semiconductor body 410 adjacent to the third gate 430(*c*), in combination, form the isolation region 440 that electrically isolates the first semiconductor body 410.1 from the second semiconductor body 410.2.

This isolation layer 441 in the isolation region 440 shown in either the semiconductor structure 400A of FIG. 25 or 400B of FIG. 26 can comprise, for example, a silicon dioxide layer, a silicon nitride layer, a silicon oxynitride layer or any other suitable isolation layer. Furthermore, it should be noted that this isolation layer 441 can comprise the same material or a different material that than used for the gate sidewall spacers 420 and/or the gate dielectric layer 431.

Additional features that complete the semiconductor structures 400A and 400B, respectively, can include, but are not limited to, one or more interlayer dielectrics 470 over the first and second FETs 491-492 and contacts 475 through the interlayer dielectric(s) 470 to the various components of the first and second FETs 491-492 (e.g., to the first and second gates 430(*a*) and 430(*b*) of the first and second FETs 491 and 492, respectively). Interlayer dielectrics and contacts are well known in the art and, thus, the details of these features have been omitted from this specification in order to allow the reader to focus on the salient aspects of the disclosed method.

It should be noted that in FIGS. 16, 17, and 18B, the dielectric layer 450 covers the source/drain regions 412 within the elongated semiconductor body 410. Consequently, the source/drain regions 412 would not actually be visible in the top view of the partially completed structures shown and, thus, they are depicted in the above-mentioned Figures with a dotted line simply to show relative positioning below the dielectric layer 450.

Each method described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should be understood that the terminology used herein is for the purpose of describing the disclosed semiconductor structures and methods and is not intended to be limiting. For example, as used herein, the singular forms "a", "an" and "the" are intended to include the plural forms as well, unless the context clearly indicates otherwise. Additionally, as used herein, the terms "comprises" "comprising", "includes" and/or "including" specify the presence of stated features, integers, steps, operations, elements, and/or components, but do not preclude the presence or addition of one or more other features, integers, steps, operations, elements, components, and/or groups thereof. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "on", "in direct contact", "abutting", "directly adjacent to", etc., are intended to indicate that at least one element physically contacts another element (without other elements separating the described elements). The corresponding structures, materials, acts, and equivalents of all means or step plus function elements in the claims below are intended to include any structure, material, or act for performing the function in combination with other claimed elements as specifically claimed.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

Therefore, disclosed above are methods of forming semiconductor structures comprising multiple field effect transistors (FETs). These methods each use a gate cut process following final gate formation in order to allow for an increase in device density. For example, in one method, an elongated gate (e.g., an elongated replacement metal gate) can be formed across at least two semiconductor bodies, including a first semiconductor body for a first FET and a second semiconductor body for a second FET. Then, an opening can be formed that extends vertically into a portion of the elongated gate between the two semiconductor bodies, cutting at least the gate conductor layer of the elongated gate. This opening can be filled with an isolation layer so as to form an isolation region that effectively segments the elongated gate into a first gate for the first FET and a second gate for the second FET and that electrically isolates the first gate from the second gate. In another method, multiple gates (e.g., replacement metal gates), including a first gate for a first FET, a second gate for a second FET and a third gate between the first and second gates, can be formed across an elongated semiconductor body. Then, an isolation region can be formed that extends through a portion of the third gate and further through a corresponding portion of the elongated semiconductor body adjacent to the third gate. This isolation region can effectively segment the elongated semiconductor body into two discrete semiconductor bodies for the first FET and the second FET, respectively, and can electrically isolate those semiconductor bodies. Also disclosed are the semiconductor structures resulting from these methods.

What is claimed is:

1. A method of forming a semiconductor structure, said method comprising:
    forming an elongated semiconductor body as an elongated semiconductor fin;
    forming multiple gates across said elongated semiconductor body, said multiple gates comprising a first gate for a first field effect transistor, a second gate for a second field effect transistor and a third gate between said first gate and said second gate;
    after said forming of said multiple gates, forming an isolation region that extends through a portion of said third gate and further through a corresponding portion of said elongated semiconductor body where said third gate crosses said elongated semiconductor body, said isolation region segmenting said elongated semiconductor body into a first semiconductor body for said first field effect transistor and a second semiconductor body for said second field effect transistor and electrically isolating said first semiconductor body from said second semiconductor body; and,
    forming contacts to said first gate and said second gate.

2. The method of claim 1, said forming of said isolation region comprising:
    forming an opening that extends through said portion of said third gate and further through said corresponding portion of said elongated semiconductor body in order to physically segment said elongated semiconductor body into said first semiconductor body and said second semiconductor body; and,
    forming at least one isolation layer within said opening.

3. The method of claim 1, said forming of said isolation region comprising:
    forming an opening that extends through said portion of said third gate and exposes said corresponding portion of said elongated semiconductor body;
    performing a dopant implantation process to form a dopant implant region in said corresponding portion of said elongated semiconductor body; and,
    forming at least one isolation layer within said opening.

4. The method of claim 1, said forming of said elongated semiconductor body comprising forming said elongated semiconductor body on any one of a bulk semiconductor wafer and a semiconductor-on-insulator wafer.

5. The method of claim 1, said forming of said multiple gates comprising forming said multiple gates adjacent to opposing sides and a top of said elongated semiconductor fin.

6. The method of claim 1, said forming of said multiple gates comprising forming metal gates, each metal gate being laterally surrounded by a gate sidewall spacer and comprising a conformal high-K gate dielectric layer and a gate conductor layer on said conformal high-K gate dielectric layer such that said conformal high-K gate dielectric layer is positioned between said gate conductor layer and said elongated semiconductor body and further positioned between said gate conductor layer and said gate sidewall spacer, said gate conductor layer comprising at least one metal.

7. A semiconductor structure comprising:
an elongated semiconductor body comprising an elongated semiconductor fin;
multiple gates across said elongated semiconductor body, said multiple gates comprising a first gate for a first field effect transistor, a second gate for a second field effect transistor, and a third gate between said first gate and said second gate;
an isolation region positioned where said third gate crosses said elongated semiconductor body, said isolation region segments said elongated semiconductor body into a first semiconductor body for said first field effect transistor and a second semiconductor body for said second field effect transistor and electrically isolates said first semiconductor body from said second semiconductor body; and,
contacts to said first gate and said second gate.

8. The semiconductor structure of claim 7, said isolation region comprising:
an opening that extends through said elongated semiconductor body in order to physically segment said elongated semiconductor body into said first semiconductor body and said second semiconductor body; and,
at least one isolation layer within said opening.

9. The semiconductor structure of claim 7, said isolation region comprising:
an opening that extends through said elongated semiconductor body;
a dopant implant region in said elongated semiconductor body exposed within said opening; and,
at least one isolation layer within said opening.

10. The semiconductor structure of claim 7, said elongated semiconductor body being on any one of a bulk semiconductor substrate and an insulator layer.

11. The semiconductor structure of claim 7, said multiple gates being adjacent to opposing sides and a top of said elongated semiconductor fin.

12. The semiconductor structure of claim 7, said multiple gates comprising metal gates, each metal gate being laterally surrounded by a gate sidewall spacer and comprising a conformal high-K gate dielectric layer and a gate conductor layer on said conformal high-K gate dielectric layer such that said conformal high-K gate dielectric layer is positioned between said gate conductor layer and said elongated semiconductor body and further positioned between said gate conductor layer and said gate sidewall spacer, said gate conductor layer comprising at least one metal.

13. A semiconductor structure comprising:
an elongated semiconductor body comprising an elongated semiconductor fin;
multiple gates across said elongated semiconductor body, said multiple gates comprising a first gate for a first field effect transistor, a second gate for a second field effect transistor and a third gate between said first gate and said second gate;
an isolation region that extends through a portion of said third gate and further through a corresponding portion of said elongated semiconductor body where said third gate crosses said elongated semiconductor body, said isolation region segmenting said elongated semiconductor body into a first semiconductor body for said first field effect transistor and a second semiconductor body for said second field effect transistor and electrically isolating said first semiconductor body from said second semiconductor body; and,
contacts to said first gate and said second gate.

14. The semiconductor structure of claim 13, said isolation region comprising:
an opening that extends through said portion of said third gate and further through said corresponding portion of said elongated semiconductor body in order to physically segment said elongated semiconductor body into said first semiconductor body and said second semiconductor body; and,
at least one isolation layer within said opening.

15. The semiconductor structure of claim 13, said isolation region comprising:
an opening that extends through said portion of said third gate;
a dopant implant region in said corresponding portion of said elongated semiconductor body exposed within said opening; and,
at least one isolation layer within said opening.

16. The semiconductor structure of claim 13, said elongated semiconductor body being on any one of a bulk semiconductor substrate and an insulator layer.

17. The semiconductor structure of claim 13, said multiple gates being adjacent to opposing sides and a top of said elongated semiconductor fin.

18. The semiconductor structure of claim 13, said multiple gates comprising metal gates, each metal gate being laterally surrounded by a gate sidewall spacer and comprising a conformal high-K gate dielectric layer and a gate conductor layer on said conformal high-K gate dielectric layer such that said conformal high-K gate dielectric layer is positioned between said gate conductor layer and said elongated semiconductor body and further positioned between said gate conductor layer and said gate sidewall spacer, said gate conductor layer comprising at least one metal.

* * * * *